United States Patent [19]
Sato et al.

[11] Patent Number: 5,409,866
[45] Date of Patent: Apr. 25, 1995

[54] PROCESS FOR MANUFACTURING A SEMICONDUCTOR DEVICE AFFIXED TO AN UPPER AND A LOWER LEADFRAME

[75] Inventors: Mitsutaka Sato; Junichi Kasai; Masanori Yoshimoto, all of Kawasaki; Kouichi Takeshita, Satsuma, all of Japan

[73] Assignees: Fujitsu Ltd., Kawasaki; Kyushu Fujitsu Electronics Ltd., Kagoshima, both of Japan

[21] Appl. No.: 996,589

[22] Filed: Dec. 24, 1992

[30] Foreign Application Priority Data

Dec. 27, 1991 [JP] Japan .................................. 3-347283
Apr. 14, 1992 [JP] Japan .................................. 4-094524

[51] Int. Cl.⁶ ..................... H01L 21/56; H01L 21/58; H01L 21/603
[52] U.S. Cl. .................... 437/211; 437/217; 437/220; 257/672; 264/272.17
[58] Field of Search .............. 437/211, 217, 207, 214, 437/220; 257/672, 676; 249/85, 95; 264/272.15, 272.17, 277

[56] References Cited

U.S. PATENT DOCUMENTS

| | | | |
|---|---|---|---|
| 3,778,887 | 12/1973 | Suzuki et al. | 437/207 |
| 4,234,666 | 11/1980 | Gursky | 257/676 |
| 4,984,059 | 1/1991 | Kubota et al. | 357/68 |
| 5,172,214 | 12/1992 | Casto | 437/902 |

FOREIGN PATENT DOCUMENTS 59-66157  4/1984  Japan.
61-218139  9/1986  Japan.

Primary Examiner—Olik Chaudhuri
Assistant Examiner—David E. Graybill
Attorney, Agent, or Firm—Staas & Halsey

[57] ABSTRACT

A process for manufacturing semiconductor device including a semiconductor chip having top and bottom surfaces, upper leads electrically coupled to the semiconductor chip, where a first gap is formed between the upper leads and the top surface of the semiconductor chip, lower leads electrically coupled to the semiconductor chip, where a second gap is formed between the lower leads and the bottom surface of the semiconductor chip, and an encapsulating resin which encapsulates the semiconductor chip so as to maintain the first and second gaps.

24 Claims, 29 Drawing Sheets

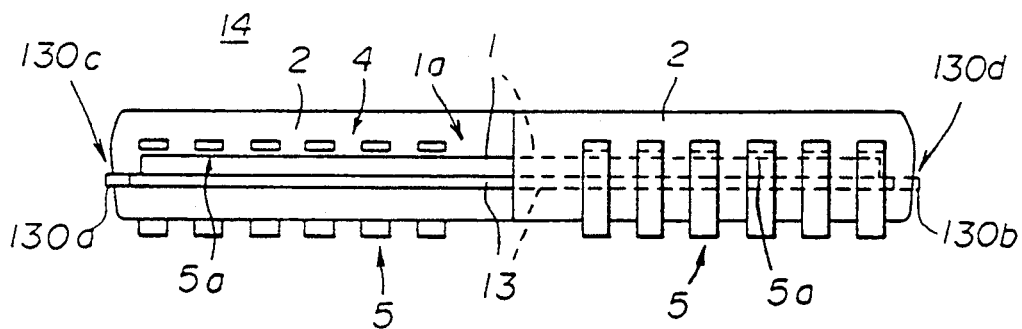
FIG. 12A
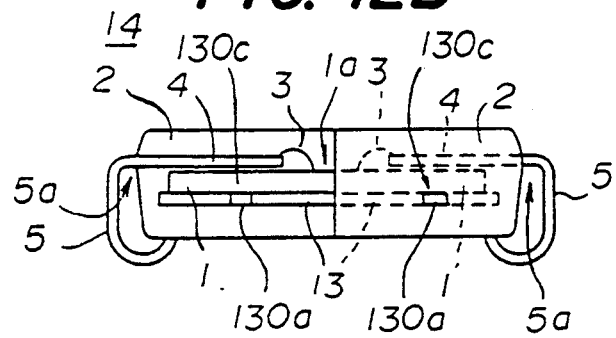
FIG. 12B
FIG. 13
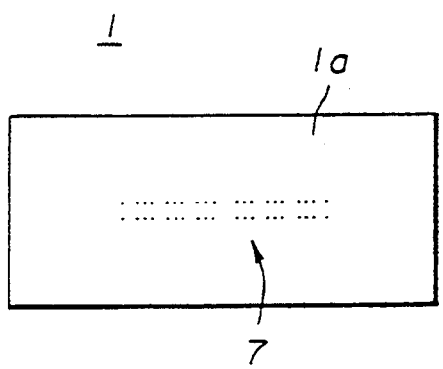

FIG. 15A
FIG. 15C
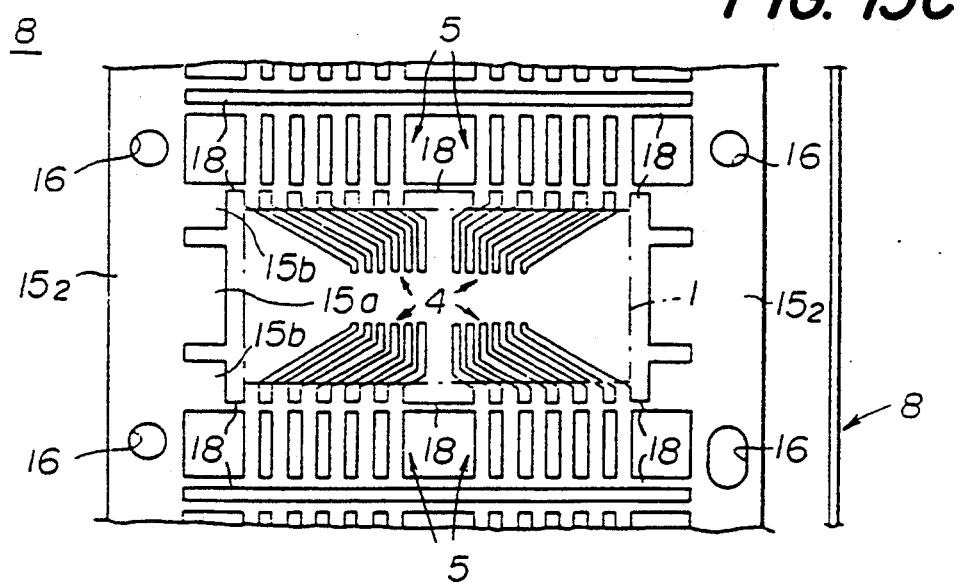
FIG. 15B

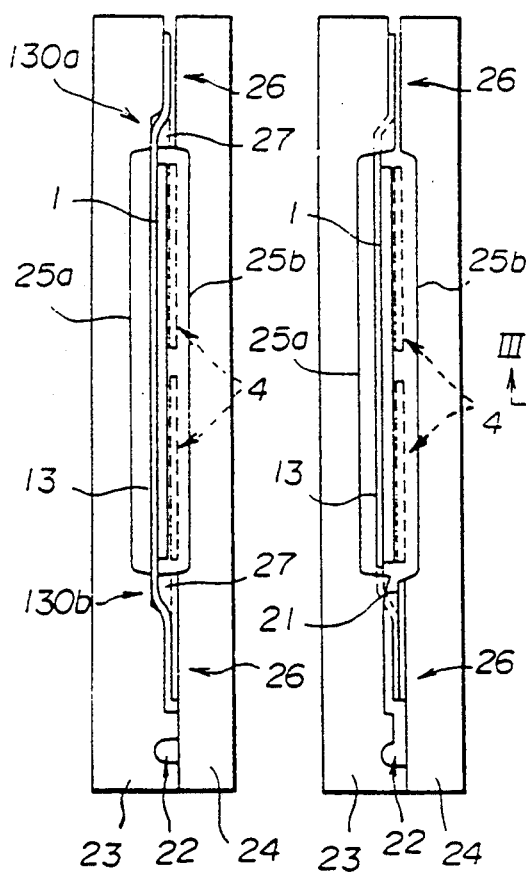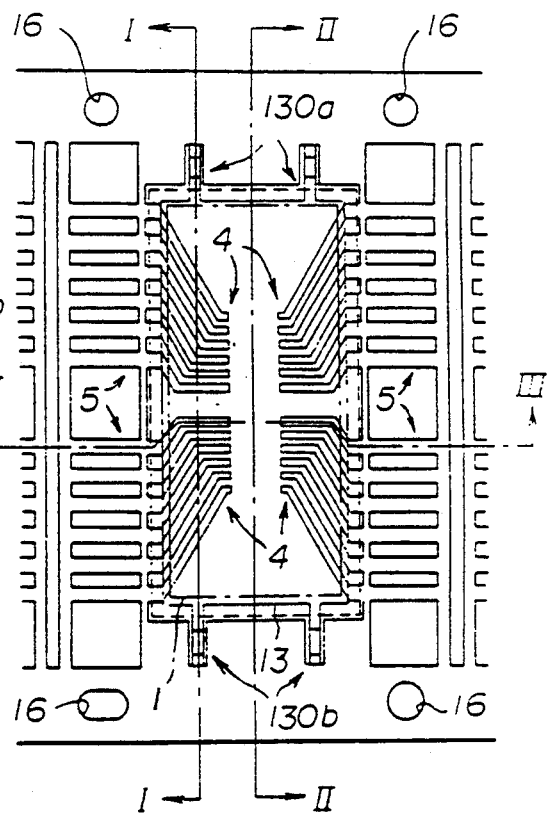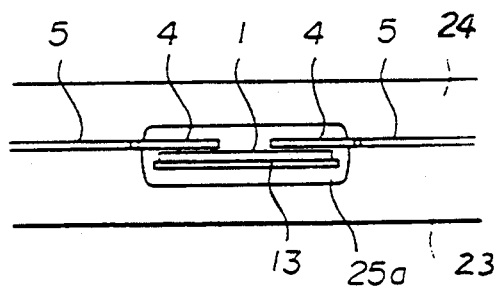

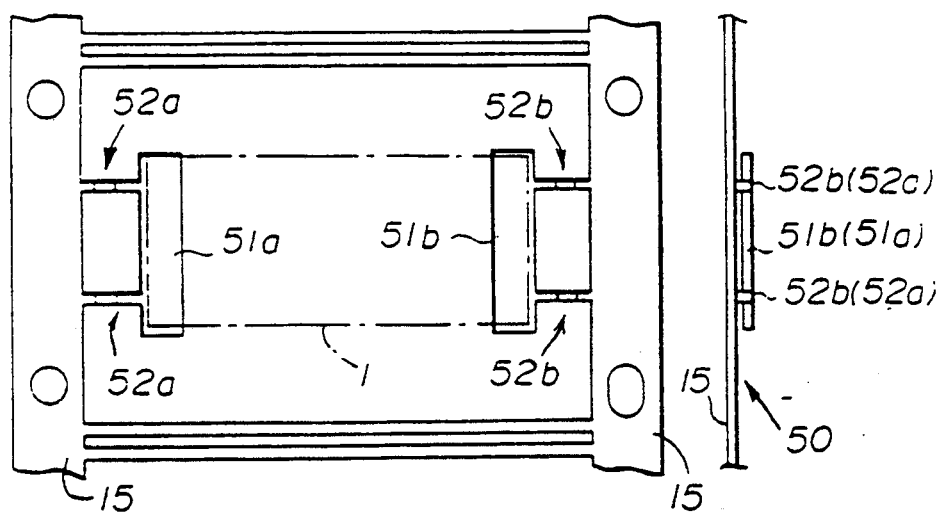
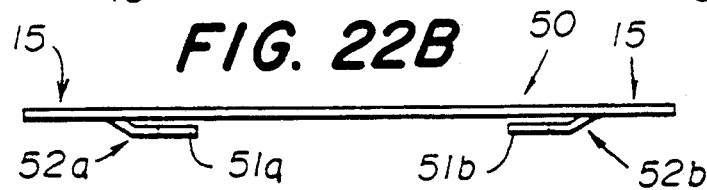

FIG. 26
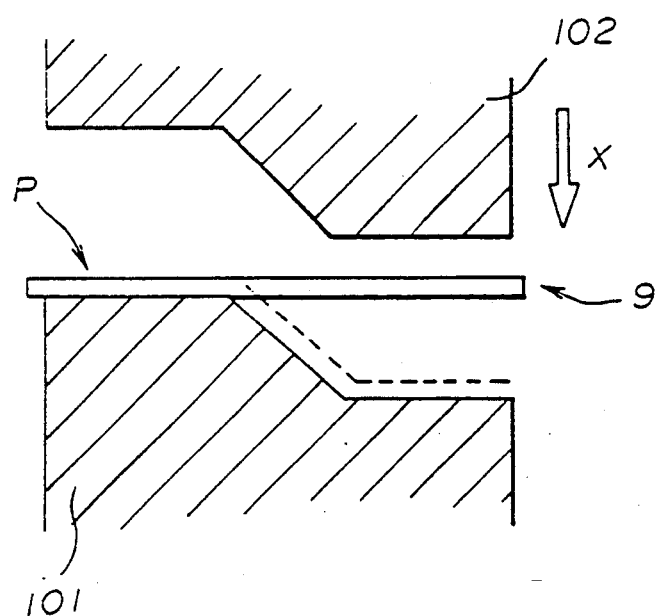
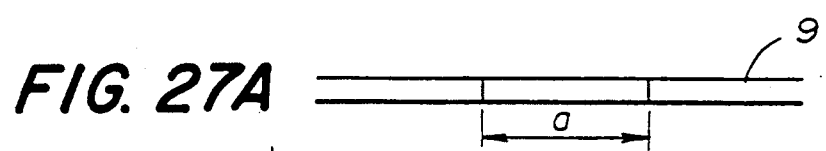
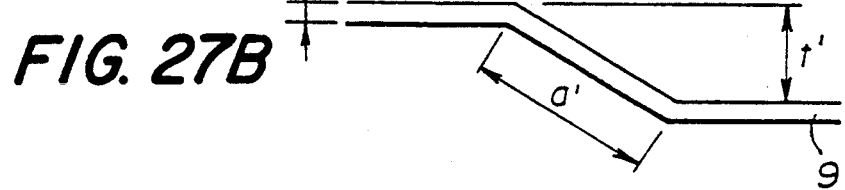

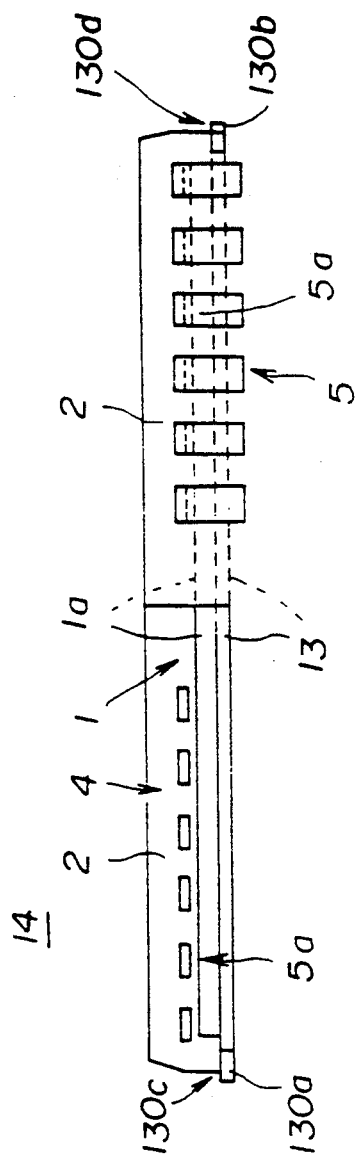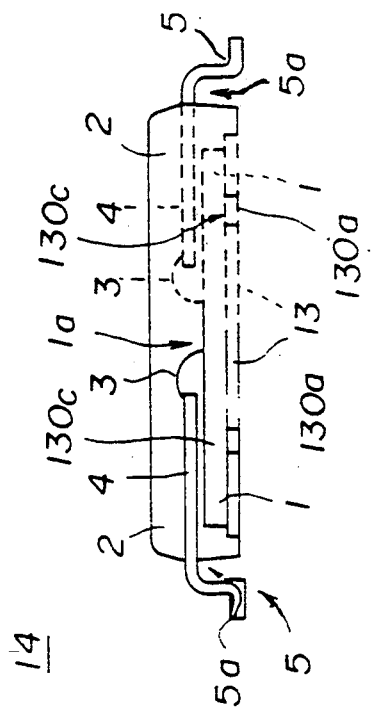

PROCESS FOR MANUFACTURING A SEMICONDUCTOR DEVICE AFFIXED TO AN UPPER AND A LOWER LEADFRAME

BACKGROUND OF THE INVENTION

The present invention generally relates to semiconductor devices and methods of producing the same, and more particularly to a semiconductor device which is resin encapsulated and to a method of producing such a resin encapsulated semiconductor device.

Recently, although the size of the semiconductor chip of the resin encapsulated semiconductor device has increased, there are demands to reduce the side of the package itself. However, in the existing semiconductor device which uses the lead frame having the two-dimensional structure, there is a limit to reducing the size of the package. Furthermore, when the size of the package is reduced to the limit, there are problems in that the mechanical strength, reliability and the like of the semiconductor device deteriorate.

Accordingly, there are proposals to use the top or bottom surface of the semiconductor chip which was conventionally unused by arranging the leads, selectively, on the top or bottom surface of the semiconductor chip, so that the leads have a three-dimensional structure. The COL (Chip on Lead) and the LOC (Lead on Chip) are examples of such a three-dimensional structure, and a Japanese Laid-Open Patent Application No. 61-218139 proposes such a three-dimensional structure.

FIGS. 1(-A) and 1(B) show an example of a conventional semiconductor device having the COL structure. FIG. 1(A) shows a plan view of the semiconductor device with a part of an encapsulating resin omitted, and FIG. 1(B) shows a front view of the semiconductor device with a part of the encapsulating resin omitted.

In FIGS. 1(A) and 1(B), inner leads 4 are arranged in a predetermined shape, and a stepped part 4a is provided at a part where a semiconductor chip 1 is mounted. The semiconductor chip 1 is fixed above the inner leads 4 via an insulator 6. Electrodes of the semiconductor chip 1 and ends of the inner leads 4 are connected via bonding wires 3, and the entire semiconductor device, excluding the outer leads 5, is packaged by an encapsulating resin 2.

Hence, according to the COL structure, the inner leads 4 run on the lower side of the semiconductor chip 1 to form the package having the three-dimensional structure.

FIGS. 2(A) and 2(B) show an example of a conventional semiconductor device having the LOC structure. FIG. 2(A) shows a plan view of the semiconductor device with a part of the encapsulating resin omitted, and FIG. 2(B) shows a front view of the semiconductor device with a part of the encapsulating resin omitted. In FIGS. 2(A) and 2(B), those parts which are essentially the same as those corresponding parts in FIGS. 1(A) and 1(B) are designated by the same reference numerals, and a description thereof will be omitted.

In FIGS. 2(A) and 2(B), the insulator 6 is provided on the semiconductor chip 1, and the inner leads 4 are arranged on top of the insulator 6. The ends 4b of the inner leads 4 and the electrodes of the semiconductor chip 1 are connected via the bonding wires 3, and the entire semiconductor device, excluding the outer leads 5, is packaged by an encapsulating resin 2.

Hence, according to the LOC structure, the inner leads 4 run on the upper side of the semiconductor chip 1 to form the package having the three-dimensional structure.

However, according to the COL and LOC structures, the inner leads 4 run only on the lower or upper side of the semiconductor chip 1, and this arrangement is insufficient for efficiently providing the necessary wiring for a more complex circuit.

In addition, the insulator 6 must be provided between the semiconductor chip 1 and the inner leads 4. If the matching of this insulator 6 and the encapsulating resin 2 is poor or the adhesion between the insulator 6 and the encapsulating resin 2 is insufficient, there is a problem in that a crack is easily formed in the encapsulating resin 2 after the packaging. If such a crack is formed in the encapsulating resin 2, the reliability of the semiconductor device greatly deteriorates.

Furthermore, particularly in the case of the LOC structure, the insulator 6 provided on the circuit forming surface of the semiconductor chip 1 is a thin insulator film, and the inner leads 4 arranged on this thin insulator film, is made of a metal having a large coefficient of linear expansion. For this reason, the inner leads 4 undergo a large expansion when the semiconductor device operates and the semiconductor chip 1 generates heat, and a large difference is introduced between the expansion of the semiconductor chip 1 and the expansion of the inner leads 4. A stress is generated at the surface of the semiconductor chip 1 due to this difference in the expansions, thereby applying forces on and deforming the circuits within the semiconductor chip 1.

An improved semiconductor device shown in FIG. 3 having the LOC structure was thus proposed in a Japanese Laid-Open Patent Application No. 59-66157 (Published Application No. 4-1503). In FIG. 3, (A) shows a cross-sectional side view of the semiconductor device, (B) shows a plan view of a lead frame, and (C) shows a plan view of a stage frame.

In FIGS. 3(A) to 3(C), a lead frame 8 includes inner leads 4 and outer leads 5 which are formed to predetermined shapes and connected to a frame 15. On the other hand, a stage frame 9 includes a rectangular stage 13 which is connected to a central position of the frame 15 via a bent part 10 which forms a step relative to the frame 15.

As shown in FIG. 3(A), the semiconductor chip 1 is mounted on the stage 13, and the packaging is made by the encapsulating resin 2 after overlapping (i.e., superposing) the lead frame 8 and the stage frame 9. In this state, the semiconductor chip 1 and the inner leads 4 are mutually separated by the provision of the bent part 10 in the stage frame 9. Accordingly, the semiconductor chip 1 and the inner leads 4 are isolated by the encapsulating resin 2 which exists therebetween. As a result, the problems caused by the provision of the insulator 6 in the semiconductor device shown in FIG. 2 are eliminated because the semiconductor device shown in FIG. 3 does not require the insulator 6.

However, because the bent part 10 for forming the gap between the semiconductor chip 1, which is mounted on the stage 13, and the inner leads 4 is provided inside the package, there is a new problem in that the size of the package cannot be made less than or equal to a sum of the size of the semiconductor chip 1 and the size of the bent part 10.

SUMMARY OF THE INVENTION

Accordingly, it is a general object of the present invention to provide a novel and useful semiconductor device and a method of producing the same, in which the problems described above are eliminated.

Another and more specific object of the present invention is to provide a semiconductor device comprising a semiconductor chip having top and bottom surfaces, upper leads electrically coupled to the semiconductor chip, wherein a first gap is formed between the upper leads and the top surface of the semiconductor chip, lower leads electrically coupled to the semiconductor chip, wherein a second gap is formed between the lower leads and the bottom surface of the semiconductor chip, and an encapsulating resin which encapsulates the semiconductor chip so as to maintain the first and second gaps. According to the semiconductor device of the present invention, the leads can be arranged with a large degree of freedom. It is also possible to reduce the size of the semiconductor device by efficiently arranging the leads and reducing the wiring space. In addition, no insulator, exclusively for isolating the semiconductor chip and the leads, is necessary, thereby making it possible to eliminate the problems which would be generated if such an insulator were used.

Still another object of the present invention is to provide a semiconductor device comprising a stage having top and bottom surfaces, a semiconductor chip which is mounted on the top surface of the stage and having a circuit forming surface, a plurality of leads respectively having inner and outer leads, wherein all of the inner leads have respective tip ends which are located above the circuit forming surface of the semiconductor chip and are electrically coupled to the semiconductor chip and a gap is formed between the inner leads and the circuit forming surface of the semiconductor chip, and an encapsulating resin which encapsulates the semiconductor chip and the inner leads so as to maintain the gap and so that the outer leads extend outwardly of the encapsulating resin. According to the semiconductor device of the present invention, it is possible to provide the semiconductor chip on the entire surface of the stage within the encapsulating resin, while isolating the inner leads and the semiconductor chip without the need for an insulator exclusively for the isolation. Hence, it is possible to encapsulate a semiconductor chip which has approximately the same size as the package itself, without deteriorating the reliability of the semiconductor device.

A further object of the present invention is to provide a method of producing a semiconductor device which includes a semiconductor chip mounted on a stage which is integrally formed on lower leads, upper leads which is separated from the lower leads, and an encapsulating resin which encapsulates the semiconductor chip, comprising the steps of (a) overlapping the upper leads on top of the lower leads via a spacer which is interposed between the upper leads and the stage and has a thickness greater than that of the semiconductor chip, so that a gap is formed between the upper leads and the semiconductor chip, (b) encapsulating the semiconductor chip by the encapsulating resin, and (c) removing the spacer after the step (b). According to the method of the present invention, it is possible to isolate the semiconductor chip and the inner leads without the need for a special process, and the required isolation can be achieved by the resin encapsulation made during the molding process. Therefore, it is possible to produce inexpensive semiconductor devices.

Another object of the present invention is to provide a method of producing a semiconductor device comprising the steps of (a) mounting a semiconductor chip on a stage, where the semiconductor chip has a circuit forming surface, (b) electrically connecting each of inner leads having tip ends which are located above the circuit forming surface of the semiconductor chip to the semiconductor chip, where the inner leads form leads together with outer leads, and (c) encapsulating the semiconductor chip and the inner leads by an encapsulating resin in a state where a predetermined gap is formed between the inner leads and the circuit forming surface of the semiconductor chip, so that the out leads extend outwardly of the encapsulating resin. According to the method of the present invention, it is possible to produce highly reliable semiconductor devices at a low cost and without the need for a complex process.

Other objects and further features of the present invention will be apparent from the following detailed description when read in conjunction with the accompanying drawings.

BRIEF DESCRIPTION OF THE DRAWINGS

FIGS. 12(A) and 12(B) show a third embodiment of the semiconductor device according to the present invention;

FIG. 13 is a plan view showing the semiconductor chip of the third embodiment of the semiconductor device;

FIGS. 15(A), 15(B) and 15(C) show a lead frame of the third embodiment of the semiconductor device;

FIGS. 17(A), 17(B), 17(C) and 17(D) are diagrams for explaining the second embodiment of the producing method;

FIGS. 22(A), 22(B) and 22(C), FIGS. 23(A), 23(B) and 23(C), FIGS. 24(A), 24(B) and 24(C) and FIGS. 25(A), 25(B) and 25(C) show different embodiments of the stage frame;

FIG. 26 is a diagram for explaining a process of bending the stage frame;

FIGS. 27(A) and 27(B) are diagrams for explaining expansion of stage support parts of the stage frame;

FIGS. 37(A) and 37(B) show a fifth embodiment of the semiconductor device according to the present invention.

DESCRIPTION OF THE PREFERRED EMBODIMENTS

Figure 1A:
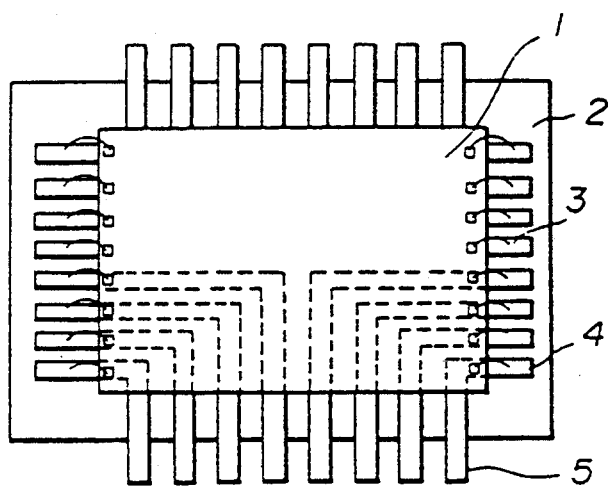
FIGS. 1(A) and 1(B) show an example of a conventional semiconductor device having the COL structure.
Figure 1B:
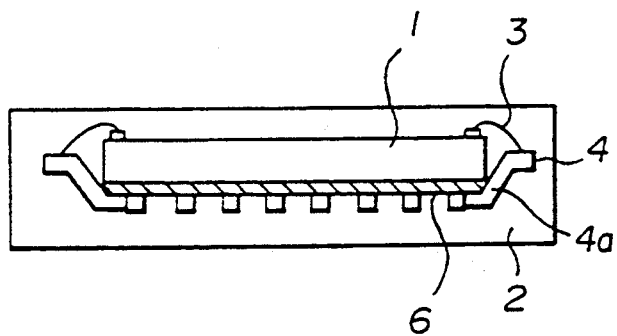
Figure 2A:
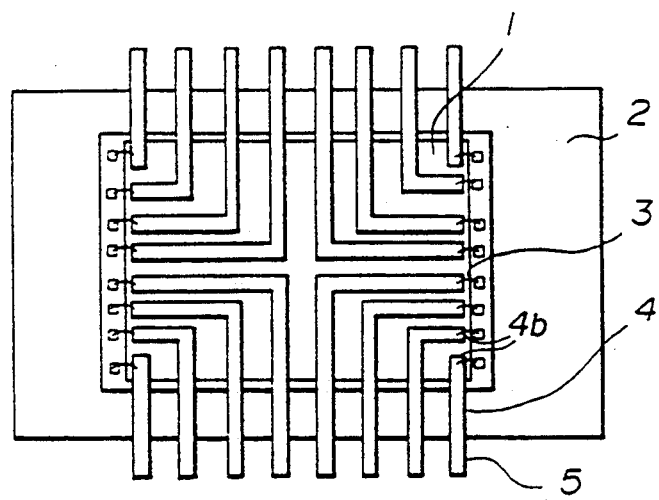
FIGS. 2(A) and 2(B) show an example of a conventional semiconductor device having the LOC structure.
Figure 2B:
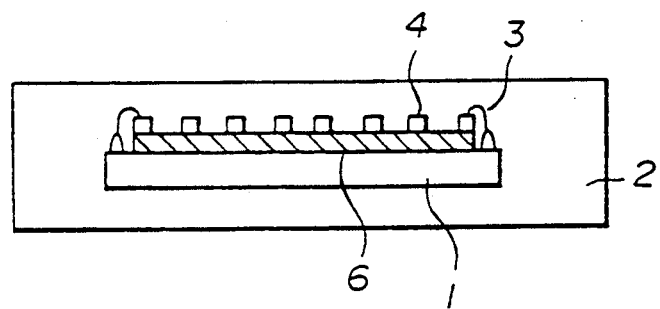
Figure 3A:
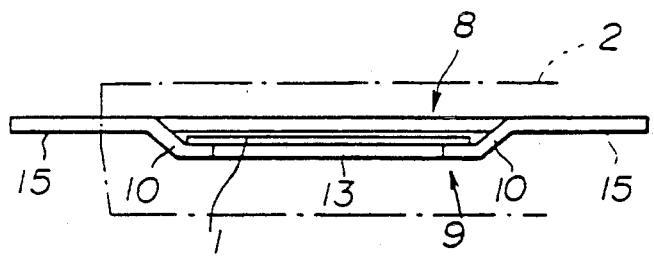
FIGS. 3(A), 3(B) and 3(C) show another examples of the conventional semiconductor device having the LOC structure.
Figure 3B:
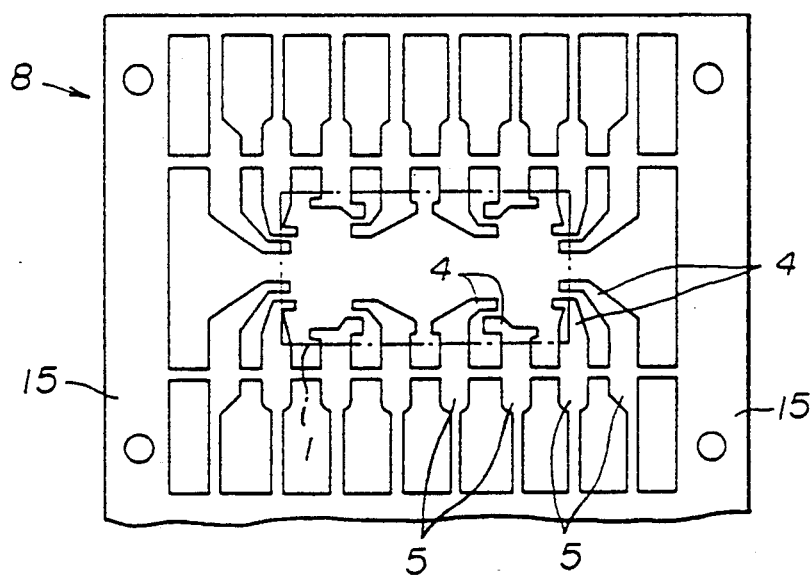
Figure 3C:
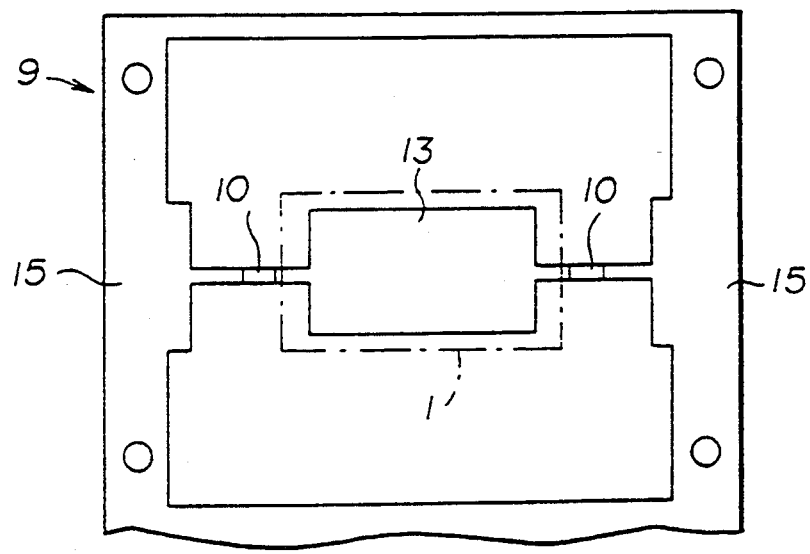
Figure 4A:
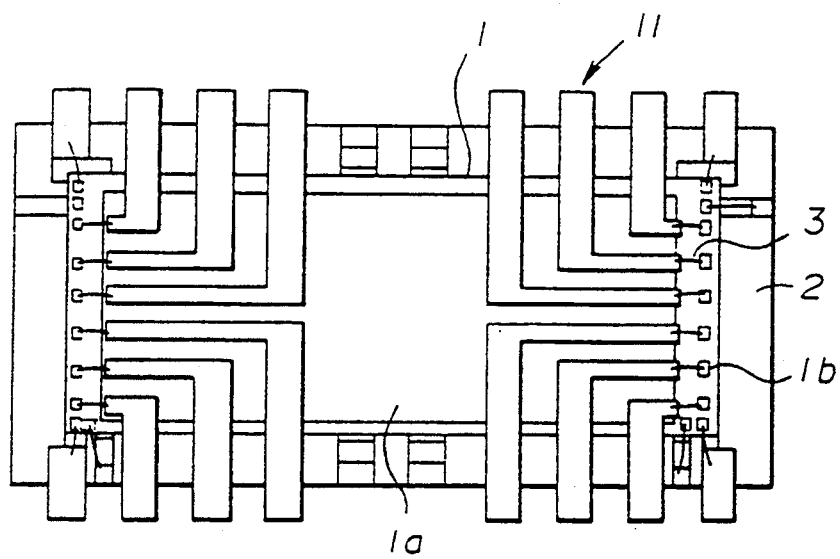
FIGS. 4(A), 4(B) and 4(C) show a first embodiment of a semiconductor device according to the present invention.
Figure 4B:
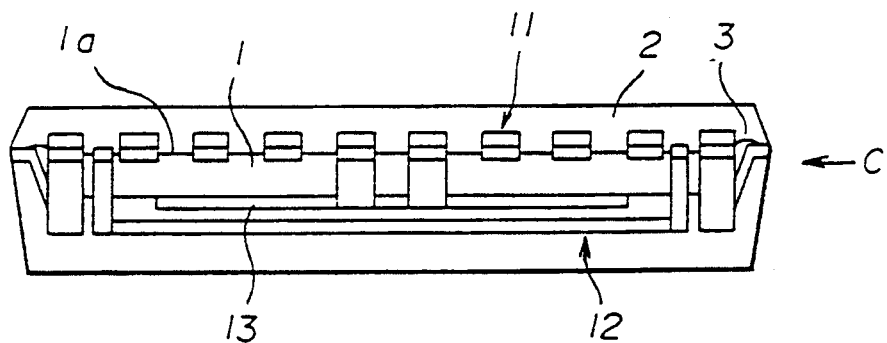
Figure 4C:
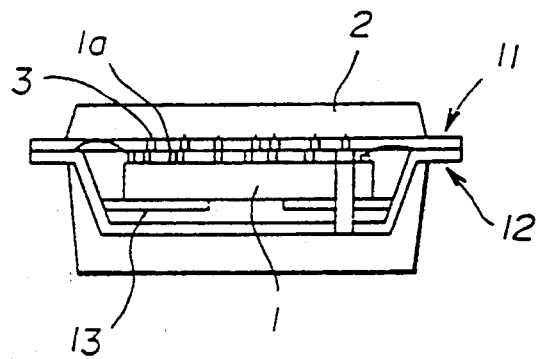

FIGS. 4(A) to 4(C) show a first embodiment of a semiconductor device according to the present invention. FIG. 4 (A) shows a plan view of the semiconductor device with a part of the encapsulating resin omitted, FIG. 4(B) shows a front view of the semiconductor device with a part of an encapsulating resin omitted, and FIG. 4(C) shows a side view of the semiconductor device viewed from a direction C in FIG. 4(B) with a part of the encapsulating resin omitted.

In FIGS. 4(A) to 4(C), a semiconductor chip 1 is positioned within a space defined by upper leads 11 and lower leads 12, and is mounted on a stage 13 which is formed by a part of the lower leads 12. The semiconductor chip 1 is affixed to the stage 13 by an adhesive agent. The upper leads 11 are approximately parallel to the lower leads 12.

A circuit forming surface 1a of the semiconductor chip 1 confronts the upper leads 11 with a predetermined gap formed therebetween. On the other hand, a surface 1b of the semiconductor chip 1, opposite to the circuit forming surface 1a, confronts the lower leads 12 with a predetermined gap formed therebetween. Electrodes 1b of the semiconductor chip 1 and predetermined ones of the upper and lower leads 11 and 12 are connected via bonding wires 3. The semiconductor chip 1 is encapsulated by an encapsulating resin 2 except for a part of the upper and lower leads 11 and 12. Accordingly, the encapsulating resin 2 fills the gap between the semiconductor chip 1 and the upper leads 11 and the gap between the semiconductor chip 1 and the lower leads 12. In other words, the semiconductor chip 1, the upper leads 11 and the lower leads 12 are fixed in a mutually isolated state.

Therefore, according to this embodiment, the leads 11 and 12 are respectively arranged on both sides, that is, the top and bottom surfaces 1a and 1b of the semiconductor chip 1. For this reason, the degree of freedom of the circuit design is improved and a more efficient wiring can be made compared to the case where the leads are provided on only one surface of the semiconductor chip.

In addition, the semiconductor chip 1 is fixed on the stage 13, and the encapsulating resin 2 isolates the semiconductor chip 1 and the upper and lower leads 11 and 12. Hence, there is no need to provide an insulator exclusively for isolating the semiconductor chip 1 from the leads. As a result, this embodiment can prevent the package from cracking due to insufficient adhesion between the insulator and the encapsulating resin.

Furthermore, this embodiment can be produced by a conventional method of producing the semiconductor device, and no new or special process is required which would otherwise increase the cost of the semiconductor device.

Figure 5A:
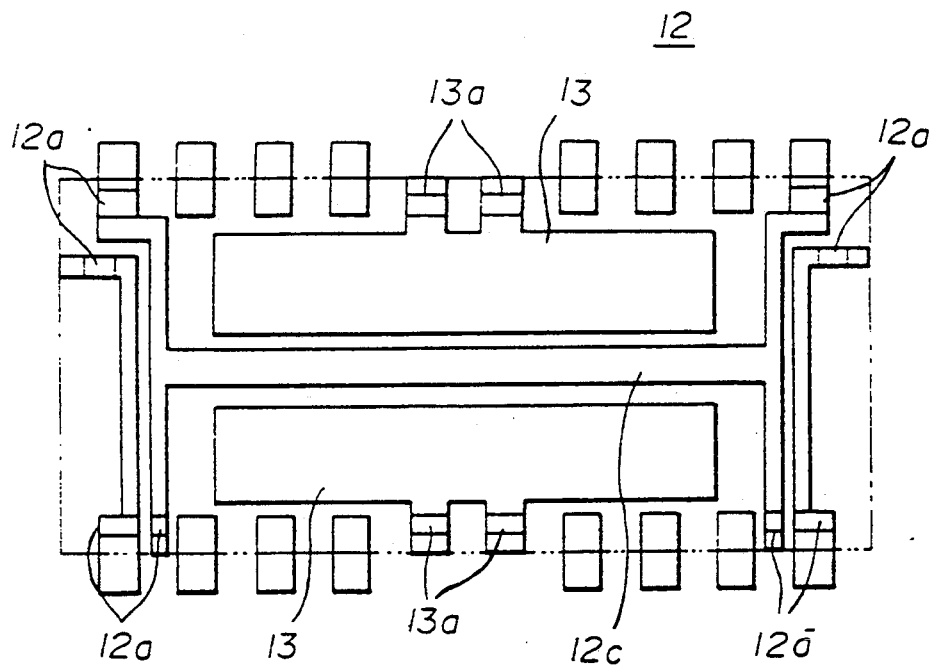
FIGS. 5(A) and 5(B) show lower leads of the first embodiment of the semiconductor device in more detail.
Figure 5B:
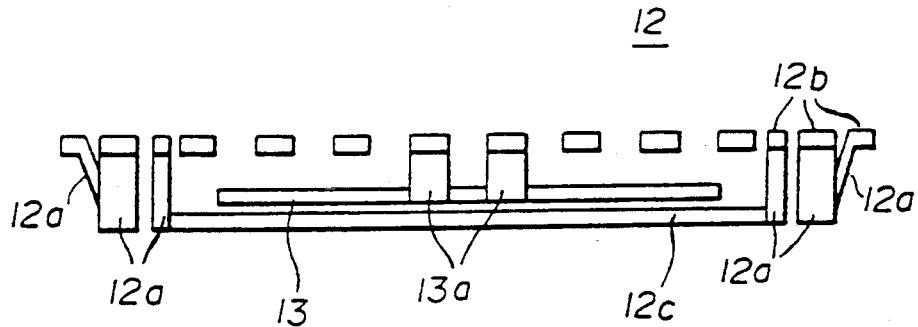

FIGS. 5(A) and 5(B) show the shape of the lower leads 12 in more detail. FIG. 5(A) shows a plan view of the lower leads 12, and FIG. 5(B) shows a side view of the lower leads 12. In FIG. 5(A), a two-dot chain line indicates a boundary of the encapsulating resin 2.

Each of the lower leads 12 and the stage 13 are integrally connected at an outer part before the semiconductor chip 1 is encapsulated by the encapsulating resin 2 to form the semiconductor device. FIG. 5(B) shows a state where the outer part is cut off after encapsulation of the semiconductor chip 1 by the encapsulating resin 2.

The lower leads 12 have at respective ends thereof top surfaces 12b which connect to the upper leads 11. In addition, a cavity is defined by a central part of the lower leads 12 when viewed as a whole. This cavity is formed by a press, and sloping parts 12a are formed between the top surfaces 12b and the bottom surface of the cavity. Moreover, the stage 13 which is formed by a part of the lower leads 12 is located at an intermediate part between the top surfaces 12b and the bottom surface of the cavity. Sloping parts 13a are formed on the stage 13.

Figure 6:
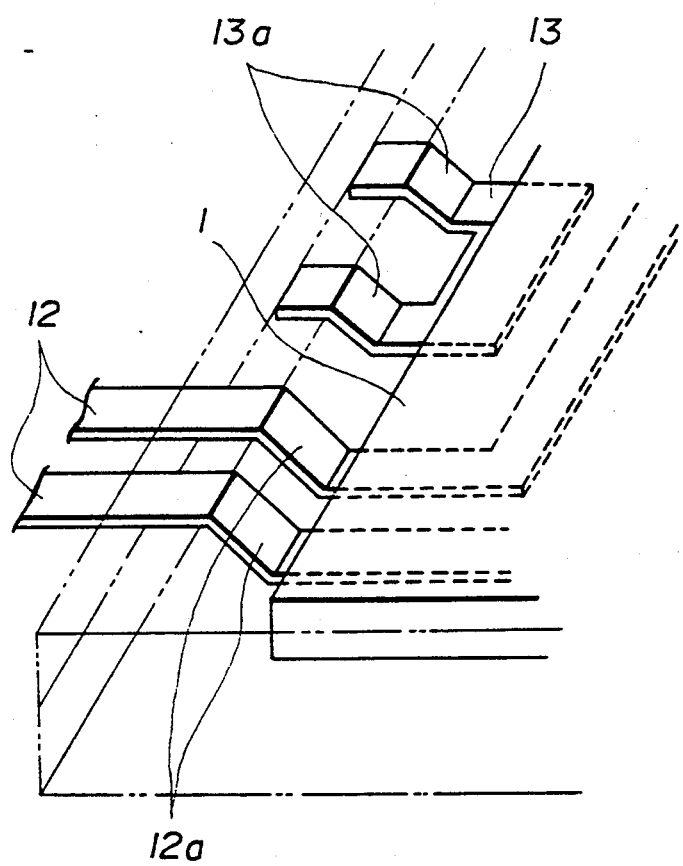
FIG. 6 is a perspective view showing the height relationship between the lower leads and a stage.
Figure 7:
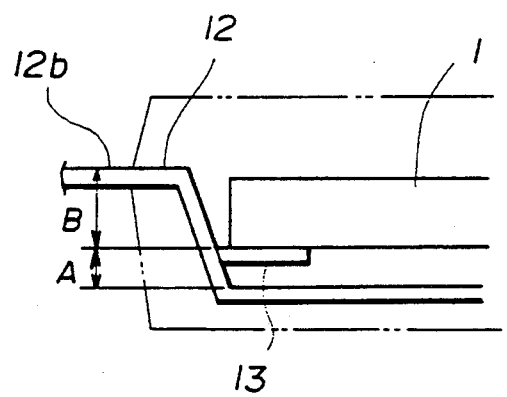
FIG. 7 is a side view showing the height relationship between the lower leads and the stage.

FIGS. 6 and 7 show the height relationship between the stage 13 and the bottom surface of the cavity defined by the lower leads 12. FIG. 6 is a perspective view and FIG. 7 is a side view. In FIGS. 6 and 7, a two-dot chain line indicates a boundary of the encapsulating resin 2.

As shown in FIG. 7, there is a height different A between the bottom surface of the cavity defined by the lower leads 12 and the mounting surface of the stage 13 for receiving the semiconductor chip 1. The encapsulating resin 2 fills this height difference (i.e., gap, or space) A, so as to isolate the semiconductor chip 1 and the lower leads 12.

On the other hand, a distance B shown in FIG. 7 from the top surfaces 12b of the lower leads 12 to the stage 13 is greater than the thickness of the semiconductor chip 1. For this reason, when the upper leads 11 are arranged on the top surfaces 12b as shown in FIG. 4, space (or gap) is formed between the semiconductor chip 1 and the upper leads 11. The encapsulating resin 2 fills this space, so as to isolate the semiconductor chip 1 and the upper leads 11.

Therefore, the problems such as cracking of the package due to the use of the insulator are eliminated in this embodiment by filling the above spaces by the encapsulating resin 2, without any need for providing an insulator exclusively for isolation between the semiconductor chip 1 and the upper and lower leads 11 and 12. Accordingly, it is possible to improve the reliability of the semiconductor device.

Figure 8:
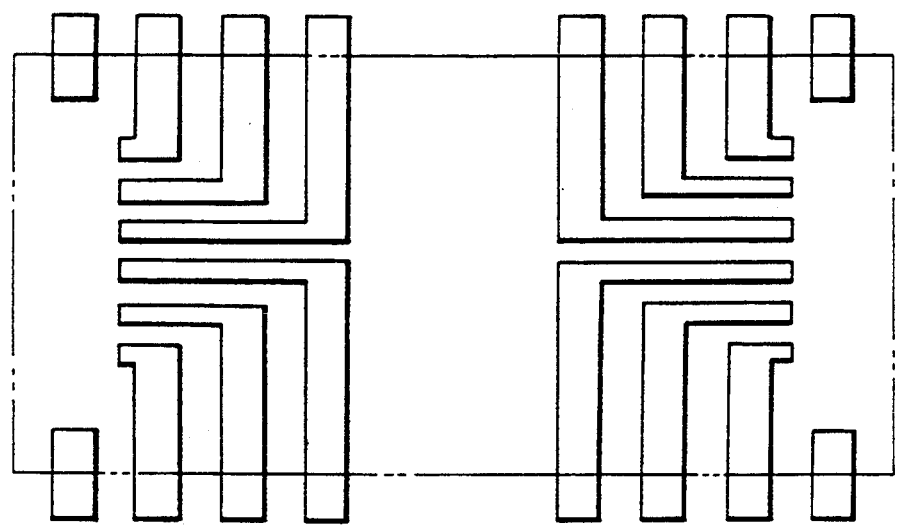
FIG. 8 is a plan view showing upper leads of the first embodiment of the semiconductor device in more detail.

FIG. 8 shows the shape of the upper leads 11 in more detail. In FIG. 8, a two-dot chain line indicates a boundary of the encapsulating resin 2.

Similarly to the lower leads 12, the upper leads are also integrally connected to an outer part before the encapsulation by the encapsulating resin 2. Each upper lead 11, since projecting to the outside of the encapsulating resin 2, has a position and size so as to overlap (i.e., be superposed on) the corresponding lower lead 12. After the encapsulation by the encapsulating resin 2, each pair of corresponding and superposed, upper and lower leads 11 and 12 functions as a single lead, i.e., in the overlapped and superposed state.

Because the upper leads 11 and the lower leads 12 are independent parts, it is possible to form a lead part having a desired function using mutually different materials for the upper and lower leads 11 and 12. For example, it is possible to use a copper alloy having a good thermal conductivity for the lower leads 12 because the semiconductor chip 1 which generates heat during operation is mounted on the stage 13 which is formed by the lower leads 12. On the other hand, it is possible to use, for the upper leads 11, a steel alloy having a smaller coefficient of expansion than that of the copper alloy since the upper leads 11 are located in the vicinity of the circuit forming surface 1a of the semiconductor chip 1.

In addition, in this embodiment, the lower leads 12 are used as power source lines 12c, and the upper leads 11 are used as signal lines. The upper leads 11 are arranged near the circuits of the semiconductor chip 1, and a potential difference may cause undesirable effects on the circuits if the upper leads 11 are used as the power source lines. For this reason, the lower leads 12 are used as the power source lines 12c. Furthermore, when the lower leads 11 are used as the power source lines 12c, the wirings of the power source lines within the semiconductor chip 1 can be formed by the lower leads 11, thereby making it possible to reduce the size of the semiconductor chip 1.

Next, a description will be given of a second embodiment of the semiconductor device according to the present invention, by referring to FIGS. 9 through 11.

Figure 9:
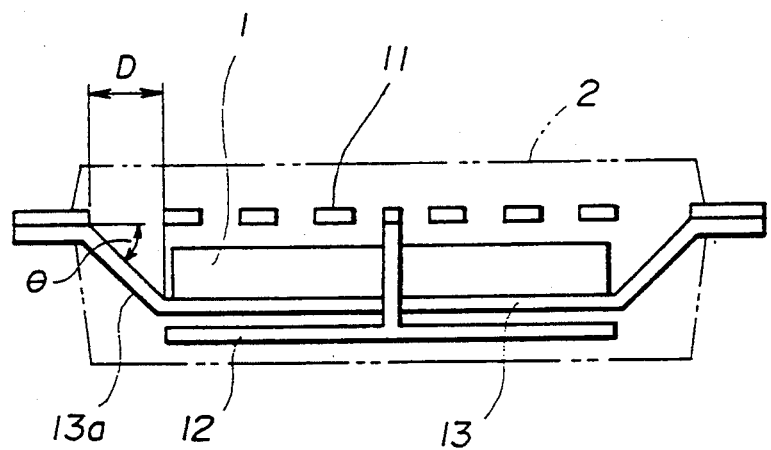
FIG. 9 is a cross sectional view for explaining a space formed at a sloping part of the stage.
Figure 10:
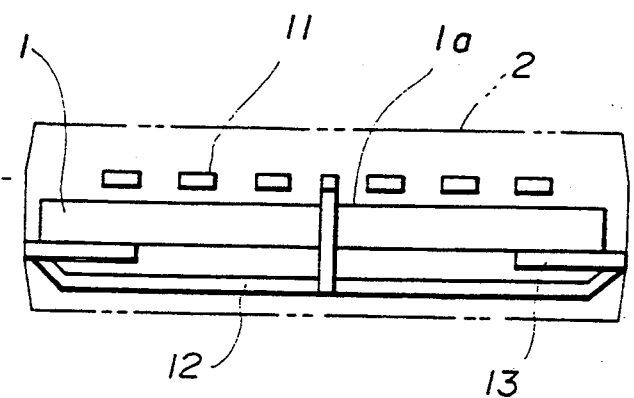
FIG. 10 is a cross sectional view showing a second embodiment of the semiconductor device according to the present invention.
Figure 11:
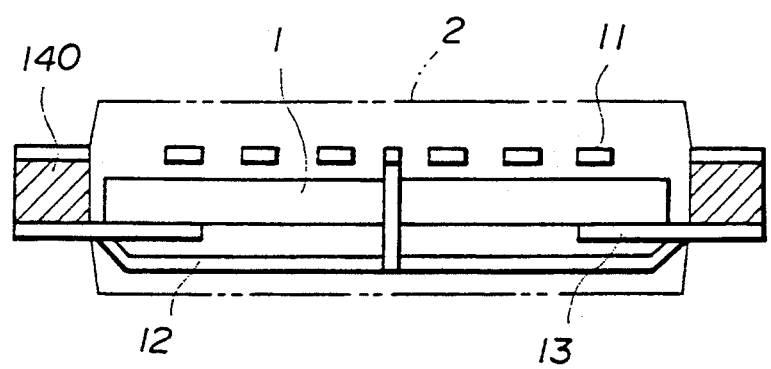
FIG. 11 is a cross sectional view for explaining a first embodiment of a producing method according to the present invention.

In FIGS. 9 through 11, those parts which are the same as those corresponding parts in FIGS. 4 through 8 are designated by the same reference numerals, and a description thereof will be omitted.

In the first embodiment, the stage 13 is supported in the longitudinal direction of the lower leads 12 as shown in FIG. 9. The semiconductor chip 1 is mounted on the stage 13, and the upper leads 11 must be separated from the semiconductor chip 1. Hence, the stage 13 connects to the lower leads 12 via the sloping parts 13a. An inclination angle $\theta$ of the sloping part 13a is 45° at the maximum due to the limitations of the press forming process. For this reason, a dead space D is formed within the encapsulating resin 2 as shown in FIG. 9.

Accordingly, in the second embodiment, measures are taken so that a larger semiconductor chip can be packaged within the encapsulating resin 2 of the same size.

In other words, as shown in FIG. 10, the stage 13 is connected to a part of the lower leads 12 on the bottom side of the semiconductor chip 1. Hence, the stage 13 does not have sloping parts which extend upwardly, and has a flat shape for the entire surface thereof. This shape of the stage 13 affords sufficient space for the encapsulating resin 2 on the sides of the semiconductor chip 1, and the mounting surface dimensions of the semiconductor chip 1 can be increased relating to the inter dimensions of the package.

Next, a description will be given of a first embodiment of a method according to the present invention for producing the semiconductor device of the invention, by referring to FIG. 11. In this embodiment of the producing method, it is assumed for the sake of convenience that the second embodiment of the semiconductor device shown in FIG. 10 is produced.

In FIG. 11, the semiconductor chip 1 is first adhered on the stage 13 by silver paste or the like. Then, a spacer 140 which is made of the same material as the leads is placed at a predetermined position on the stage 13, and the upper leads 11 are placed on top of the spacer 140. This spacer 140 has a height which is slightly greater than that of the semiconductor chip 1. Hence, a space is formed between the upper leads 11 and the circuit forming surface 1a of the semiconductor chip 1.

Thereafter, the stage 13, the spacer 140 and the upper leads 11 are fixed by a laser beam welding or the like, and the semiconductor chip 1 and the upper and lower leads 11 and 12 are bonded. An assembly which is made up of the semiconductor chip 1 and the upper and lower leads 11 and 12 is placed on a lower die of a pair of upper and lower dies used for the encapsulation. In this state, a part of the stage 13 which connects to the lower leads 12 is located at the surface where the upper and lower dies are joined, and the spacer 140 is located above this part of the stage 13. The encapsulating resin 2 is injected into the joined upper and lower dies.

After the encapsulation by the encapsulating resin 2, the semiconductor device is removed from the upper and lower dies, and a part of the spacer 140 projecting from the encapsulating resin 2 is cut and removed by a press or the like. Hence, the lower leads 12 shown in FIG. 10 are formed.

According to this embodiment of the producing method, the spacer 140 is used to separate the semiconductor chip 1 and the upper leads 11 during the production process. As a result, it is possible to eliminate the sloping parts 13a which extend upwardly from the stage 13. Consequently, the space for accommodating the semiconductor chip 1 within the encapsulating resin 2 is increased, and a larger semiconductor chip can be encapsulated within the encapsulating resin 2 of the same size when compared to the first embodiment of the semiconductor device.

Next, a description will be given of a third embodiment of the semiconductor device according to the present invention, by referring to FIGS. 12(A) and 12(B). FIG. 12(A) shows a front view of the semiconductor device with a part shown in cross section, and FIG. 12(B) shows a side view of the semiconductor device with a part shown in cross section.

A semiconductor device 14 shown in FIGS. 12(A) and 12(B) has a MF-LOC (Multi Frame-Lead on Chip) structure. That is, a semiconductor chip 1 is mounted on a stage 13, and inner leads 4 are arranged above the semiconductor chip 1 and separated from the semiconductor chip 1. The semiconductor chip 1 and the inner leads 4 are encapsulated by an encapsulating resin 2. The stage 13 is approximately parallel to the inner leads 4.

The stage 13 has an approximately rectangular plate shape, and includes two stage support parts 130a which project to the left in FIG. 12(A) and two stage support parts 130b which project to the right in FIG. 12(A). Tip ends of the stage support parts 130a and 130b extend beyond the encapsulating resin 2 and thus are exposed. The semiconductor chip 1 which is fixed on the stage 13 has an approximately rectangular shape which is slightly smaller than that of the stage 13. Circuits are formed on a circuit forming surface 1a of the semiconductor chip 1.

The inner leads 4 are arranged at constant intervals (i.e., fixed spacings) above the circuit forming surface 1a of the semiconductor chip 1 and separated from the circuit forming surface 1a. Each inner lead 4 is electrically connected to the semiconductor chip 1 via a bonding wire 3.

As shown in FIG. 12A, the distance between the stage 13 and each of the inner leads 4 is approximately constant. In addition, the distance between the circuit forming surface 1a and each of the inner leads 4 is also approximately constant. On the other hand, as shown in FIGS. 12(A) and 12(B), a first part of each inner lead 4 extends from the central part above the semiconductor chip 1 in an approximately parallel relationship relatively to the stage 13 and to the circuit forming surface 1a, and a second part of each inner lead 4 which extends outside the encapsulating resin 2 becomes an outer lead 5.

When the semiconductor device 14 is viewed from outside the encapsulating resin 2, there is a gap between a surface 5a of each outer lead 5 confronting the circuit forming surface 1a and surfaces 130c and 130d of the stage support parts 130a and 130b on the same side as the surface of the stage 13 on which the semiconductor chip 1 is mounted. The surfaces 5a, 130c and 130d extend beyond the encapsulating resin 2 and thus are exposed, and the gap is the sum of the respective thicknesses of the semiconductor chip 1 and the distance between the circuit forming surface 1a and the inner leads 4, along a direction perpendicular to the circuit forming surface 1a.

The outer leads 5 are respectively bent downwardly in FIG. 12(B) approximately at right angles outside the encapsulating resin 2 to form a J-shape. The semiconductor chip 1 is electrically connected to an external circuit (not shown) by connecting the outer leads 5 to the external circuit.

Next, a description will be given of a second embodiment of the producing method according to the present invention, by referring to FIGS. 13 through 18 (B). In this embodiment of the producing method, it is assumed for the sake of convenience that the third embodiment of the semiconductor device 14 shown in FIGS. 12(A) and 12(B) is produced.

Figure 14A:
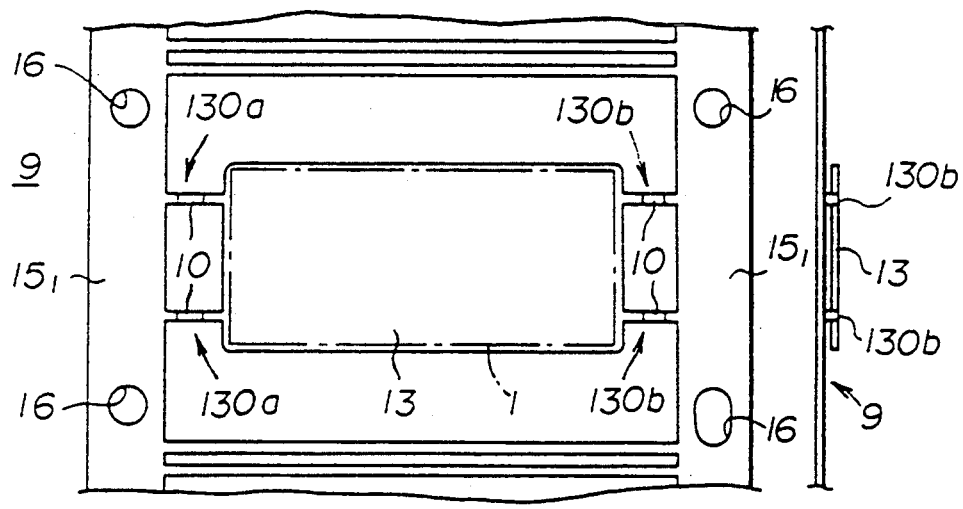
FIGS. 14(A), 14(B) and 14(C) show a stage frame of the third embodiment of the semiconductor device.
Figure 14C:
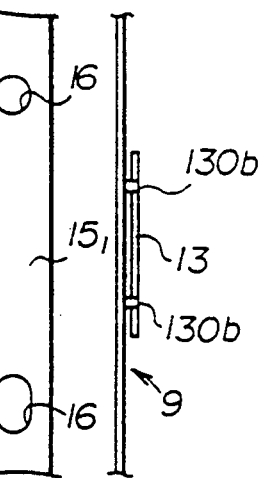
Figure 14B:
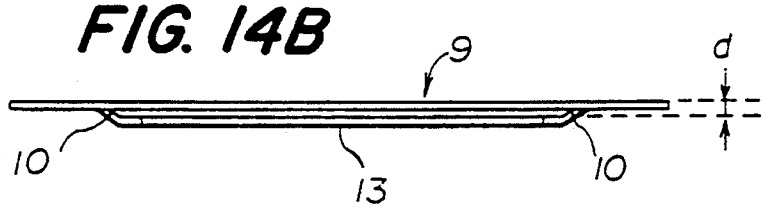

FIGS. 13 through 15 respectively show the elements forming the semiconductor device 14. FIG. 13 is a plan view of the semiconductor chip 1, FIG. 14 shows a stage frame, and FIG. 15 shows a lead frame. Each of FIGS. 14(A) and 15(A) shows a plan view and each of FIGS. 14(B) and 15(B) shows a front view.

As shown in FIG. 13, a plurality of bonding pads 7 are provided at a predetermined central part of the circuit forming surface 1a of the semiconductor chip 1. The number of bonding pads 7 corresponds to the number of terminals of the semiconductor device 14, that is, the number of outer leads 5.

In addition, as shown in FIGS. 14(A), 14(B) and 14(C), a stage frame 9 is made up of a frame $15_1$ and the rectangular stage 13 which is connected to the frame $15_1$ via the stage support parts 130a and 130b and on which the semiconductor chip 1 is mounted. The size of the stage 13 is slightly larger than that of the semiconductor chip 1, in both the vertical and horizontal directions.

The stage support parts 130a and 130b respectively include bent parts 10 which project from the stage 13 and are thereafter bent upwardly, as seen in FIG. 14(B). The bent parts 10 are further bent to match the plane of the frame $15_1$ and connect to the frame $15_1$. Accordingly, the top surface of the stage 13 is separated by a distance d from the top surface of the frame 15. This distance d is set to be greater than the thickness of the semiconductor chip 1.

A plurality of positioning holes 16 are formed in the frame $15_1$, and are used to position the frame 16 during the production process. Some of the positioning holes 16 have an oval shape, while the remaining positioning holes 16 have a circular shape. The oval shaped positioning hole 16 is provided to absorb the expansion and contraction of the frame $15_1$ during the production process. Hence, although only four positioning holes 16 are shown in FIG. 14(A) and one of the four positioning holes 16 has the oval shape, a plurality of oval shaped positioning holes 16 are actually arranged at predetermined intervals, for example. Furthermore, the oval shaped positioning holes 16 may be arranged along only one side of the frame $15_1$ or along both sides of the frame 15.

As shown in FIGS. 15(A) to 15(C), a lead frame 8 has a plate (i.e., planar) shape; the inner leads 4 and the outer leads, which extend from the inner leads 4, are respectively connected to a frame $15_2$ via connecting parts 18. The lead frame 8 is die cut to a shape such that the tip ends of the inner leads 4 are positioned to facilitate the wire bonding relative to the positions of the bonding pads 7 (FIG. 13) of the semiconductor chip 1.

Positioning holes 16 are also formed in the frame $15_2$ for the same reasons as the positioning holes 16 formed in the frame $15_1$. Furthermore, the positioning holes 16 of the frame $15_2$ and the positioning holes 16 of the frame $15_1$ are located at corresponding positions to enable accurate positioning relative to each other.

The semiconductor chip 1 is fixed on the top surface of the stage 13 of the stage frame 9, and the lead frame 8 is placed on top of the stage frame 9 by aligning the two frames via the positioning holes 16. Thereafter, the inner leads 4 and the semiconductor chip 1 are wire bonded by a wire bonding process.

Figure 16:
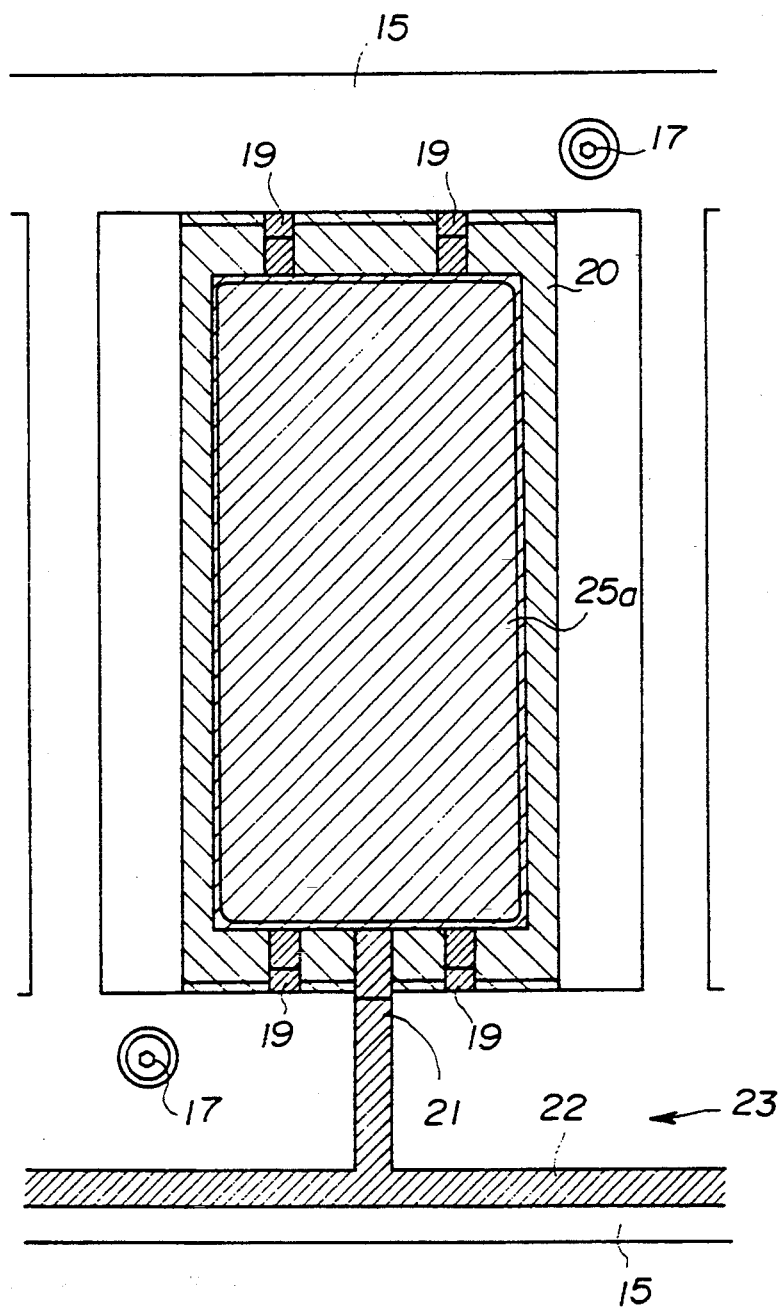
FIG. 16 is a plan view for explaining a lower die used in a second embodiment of the producing method according to the present invention.

Next, a description will be given of dies used in the second embodiment of the producing method, and the lower die in particular with reference to FIG. 16. In FIG. 16, positioning pins 17 penetrate the corresponding positioning holes 16 of the lead frame 8 and the stage frame 9, so as to align each frame and the dies. The frames $15_1$ and $15_2$ are shown as one frame 15 in FIG. 16.

A lower die 23 generally includes parts having three different depths as indicated by the different hatchings. An upper die (not shown) has a shape corresponding to this shape of the lower die 23.

The lower die 23 includes a rectangular package part 25a having the largest depth, four support parts 19 projecting, variously upwardly and downwardly in FIG. 16 from the package part 25a and having a depth next largest to the package part 25a, a gate part 21 extending down from the center of the package part 25a and having the same depth as the support parts 19, and a rectangular frame shaped lead part 20 surrounding the package part 25a and having the smallest depth.

The size of the package part 25a in the horizontal and vertical directions is slightly larger than the size of the stage 13 in the horizontal and vertical directions. Two support parts 19 project upwardly from the package part 25a and two support parts 19 project downwardly from the package part 25a in FIG. 16, and respectively extend to the ends of the frame 15. The gate part 21 extends down in FIG. 16 and connects to a runner part 22 which extends horizontally along the longitudinal direction of the frame 15. This runner part 22 has the same depth as the gate part 21.

The lead frame 8 shown in FIGS. 15(A) to 15(C) and the stage frame 9 shown in FIGS. 14(A) to 14(C) are integrally stacked, and is placed on the lower die 23, in a state wherein the positioning pins 17 of the lower die 23 penetrate the corresponding positioning holes 16 of the frames $15_1$ and $15_2$. The encapsulation by the encapsulating resin 2 is made in this state.

Next, the second embodiment of the producing method will be described in more detail with reference to FIGS. 17(A) to 17(D). FIG. 17(A) shows a state where the stacked lead frame 8 and stage frame 9 are placed on the lower die 23 and an upper die 24 is positioned on top of the lower die 23. FIG. 17(C) is a plan view, FIG. 17(A) shows a cross section along a line I—I in FIG. 17(C), FIG. 17(B) shows a cross section along a line II—II in FIG. 17(C), and FIG. 17(D) shows a cross section along a line III—III in FIG. 17(C).

In FIG. 17(D), the upper die 24 is shaped so as to hold the outer leads 5 of the lead frame 8 which project from the package part 25a and the stage frame 9 which has the stage support parts 130a and 130b (FIG. 17(A) to 17(C) at predetermined positions in cooperation with the lower die 23. In other words, the upper die 24 includes a package part 25b which has the same shape as the package part 25a of the lower die 23 at a position corresponding to the package part 25a, flat parts 26 which support the frames $15_2$ and $15_1$ of the lead frame 8 and the support frame 9, and projecting parts 27 which support the stage support parts 130a and 130b together with the support parts 19 of the lower die 23.

Figure 18A:
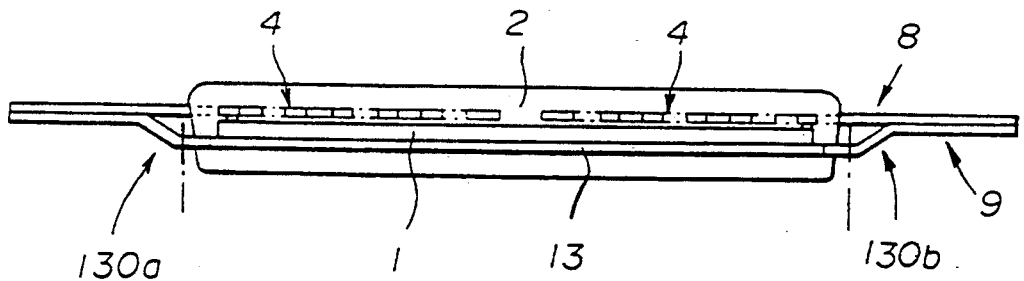
FIGS. 18(A) and 18(B) show a semicompleted product which is obtained at one stage of the second embodiment of the producing method.
Figure 18B:
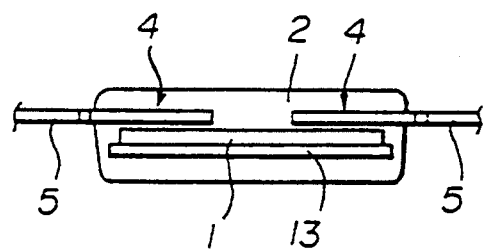

Thereafter, the encapsulating resin 2 is injected from the runner part 22 via the gate part 21, so as to form a semicompleted product 14a of the semiconductor device 14 as shown in FIGS. 18(A) and 18(B). FIG. 18(A) shows a front view of the semicompleted product 14a with a part of the encapsulating resin 2 omitted, and FIG. 18(B) shows a side view of the semicompleted product 14a with a part of the encapsulating resin 2 omitted.

The stage support parts 130a and 130b of the semicompleted product 14a shown in FIGS. 18(A) and 18(B) are cut at positions indicated by a one-dot chain line in FIG. 18(A), so as to cut the outer leads 5 to predetermined lengths. In addition, the connecting parts 18 shown in FIG. 15(A) are cut to separate each of the outer leads 5. The outer leads 5 are then formed into predetermined shapes so as to make the semiconductor device 14 shown in FIGS. 12(A) and 12(B).

Therefore, according to this embodiment of the producing method, the semiconductor device 14 which is produced has the semiconductor chip 1 mounted on the entire surface of the flat stage 13 which is provided within the encapsulating resin 2. For this reason, it is possible to encapsulate the semiconductor chip 1 which is only slightly smaller than the encapsulating resin 2 and which is larger than the semiconductor chip which could conventionally be encapsulated by the encapsulating resin in a package of the same exterior size. As a result, the size of the package can be reduced according to this embodiment.

In addition, the inner leads 4 and the circuit forming circuit 1a of the semiconductor chip 1 are isolated by the encapsulating resin 2, and no insulator is provided therebetween exclusively for the isolation. Accordingly, the reliability of the semiconductor device 14 is high in that no mechanical problems are generated, which conventionally occurred in prior art devices due to the provision of the insulator.

Figure 19A:
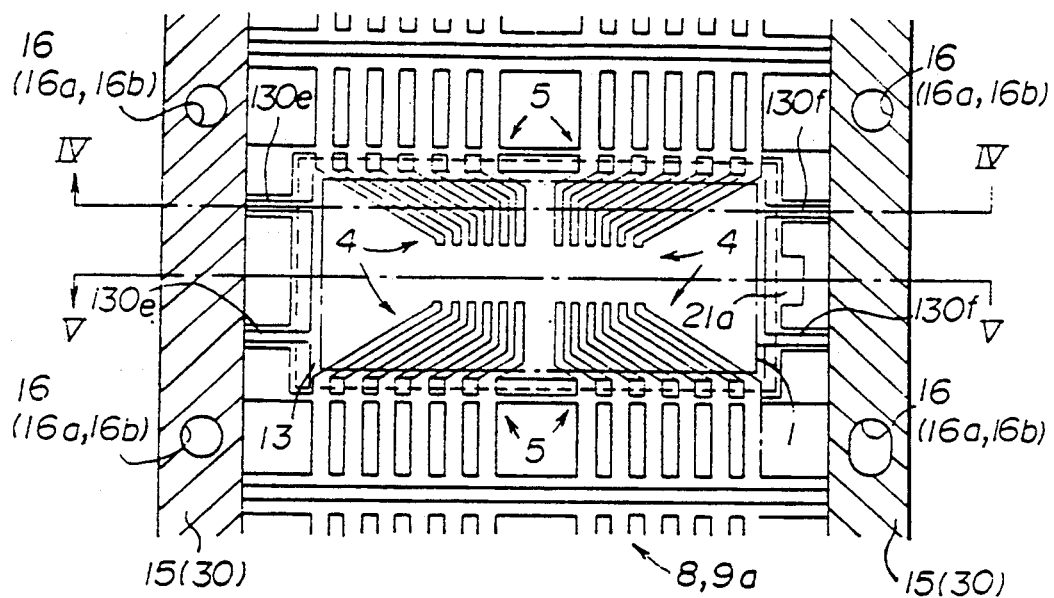
FIGS. 19(A), 19(B) and 19(C) are diagrams for explaining a third embodiment of the producing method according to the present invention.
Figure 19B:
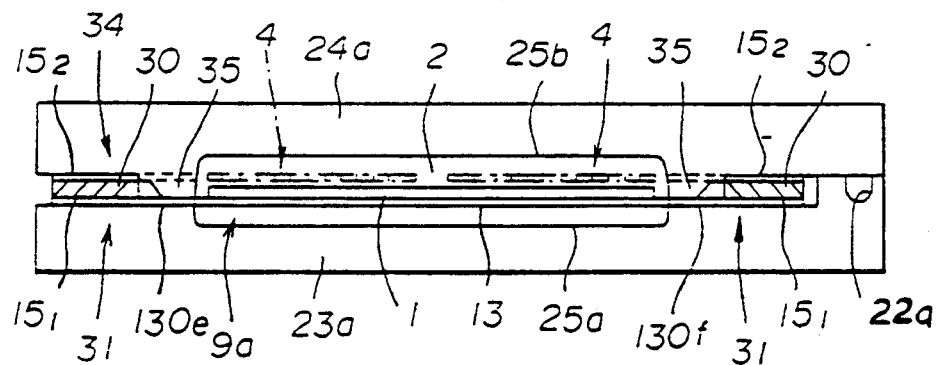

Next, a description will be given of a third embodiment of the producing method according to the present invention, by referring to FIGS. 19(A) to 19(C). In this embodiment of the producing method, it is assumed for the sake of convenience that the third embodiment of the semiconductor device 14 shown in FIGS. 12(A) and 12(B) is produced. FIG. 19(A) shows a plan view, FIG. 19(B) shows a cross sectional view along a line IV—IV in FIG. 19 (A), and FIG. 19 (C) shows a cross sectional view along a line V—V in FIG. 19(A).

In FIGS. 19(A) to 19 (C), a stage frame 9a has the semiconductor chip 1 fixed on the stage 13 thereof, and a spacer 30 indicated by a hatching is placed on the frame $15_1$ of the stage frame 9a. This spacer 30 has the same width as the frame $15_1$. The frame $15_2$ of the lead frame 8 is positioned on the spacer 30 in alignment with the frame $15_1$. The frames $15_1$ and $15_2$ and the spacer 30 are held the upper and lower dies 24a and 23a in the state shown.

The cross sectional shape of the spacer 30 is rectangular, and the thickness of the spacer 30 is greater than that of the semiconductor chip 1. Hence, the inner leads 4 are separated from the circuit forming surface 1a of the semiconductor chip I. The coefficient of linear expansion of the spacer 30 is set approximately the same as those of the lead frame 8 and the stage frame 9a.

In the plan view of FIG. 19(A), the stage frame 9a has a shape similar to that of the stage frame 9 shown in FIG. 14(A). However, the stage frame 9a has a plate (i.e., planar) shape and does not have the bending parts in the support parts 130e and 130f thereof. Positioning holes 16a are formed in the stage frame 9a at positions corresponding to the positioning holes 16 in the lead frame 8. Positioning holes 16b are also formed in the spacer 30 at positions corresponding to the positioning holes 16 and 16a.

The lower die 23a includes flat parts 31 for making contact with and supporting the frame $15_1$ of the stage frame 9a, a package part 25a which has a depth sufficient to encapsulate the semiconductor chip 1 by the encapsulating resin 2, a projecting part 32 for making contact with and supporting the projecting parts 15a and 15b which project from the frame $15_2$ of the lead frame 8 as shown in FIG. 15(A), a projecting part 33 which forms a gate part 21a, and a runner part 22a which connects to the gate part 21a.

The upper die 24a includes flat parts 34 which make contact with the frame $15_2$ of the lead frame 8, projecting parts 35 for making contact with the stage support parts 130e and 130f of the stage frame 9a from above, a package part 25b which has a depth sufficient to encapsulate the semiconductor chip 1 by the encapsulating resin 2, and a shallow connecting part 36 which connects the gate part 21a and the runner part 22a.

Thereafter, the encapsulating resin 2 is injected from the runner part 22a via the gate part 21, so as to form the semicompleted product 14a of the semiconductor device 14 as shown in FIGS. 18(A) and 18(B), similarly to the second embodiment of the producing method.

According to this third embodiment of the producing method, it is possible to simplify the production process because it is unnecessary to bend the stage frame 9a. In addition, the shapes of the upper and lower dies 24a and 23a are more simple compared to those of the upper and lower dies 24 and 23 used in the second embodiment of the producing method, thereby making it possible to reduce the cost of the upper and lower dies 24a and 23a.

Next, a description will be given of a fourth embodiment of the producing method according to the present invention, by referring to FIGS. 20(A) to 20(C). In this embodiment of the producing method, it is assumed for the sake of convenience that the third embodiment of the semiconductor device 14 shown in FIGS. 12(A) and 12(B) is produced. FIG. 20(A) shows a plan view, FIG. 20(B) shows a cross sectional view along a line VI—VI in FIG. 20(A), and FIG. 20(C) shows a cross sectional view along a line VII—VII in FIG. 20(A). In FIGS. 20(A) to 20(C), those parts which are the same as those corresponding parts in FIGS. 19(A) to 19(C) are designated by the same reference numerals, and a description thereof will be omitted.

In FIG. 20(A), a spacer 30a includes positioning holes 16c. The positioning holes 16c are located at positions corresponding to the positioning holes 16 and 16a of the lead frame 8 and the stage frame 9a.

As shown in FIGS. 20(B) and 20(C), the stage frame 9a, the spacer 30a and the lead frame 8 are aligned and placed on top of one another, and are held in this state by upper and lower dies 24b and 23b. The cross sectional shape of the spacer 30a is rectangular, and the thickness of the spacer 30a is greater than that of the lead frame 8 are separated from the circuit forming surface 1a of the semiconductor chip 1.

Figure 19C:
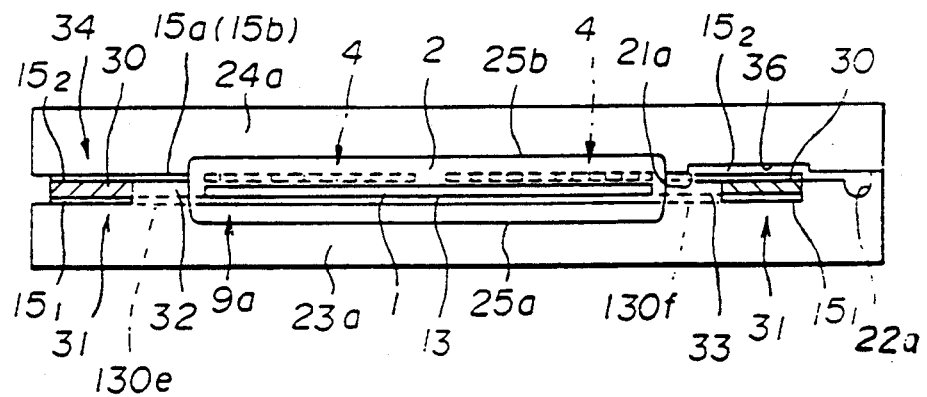
Figure 20A:
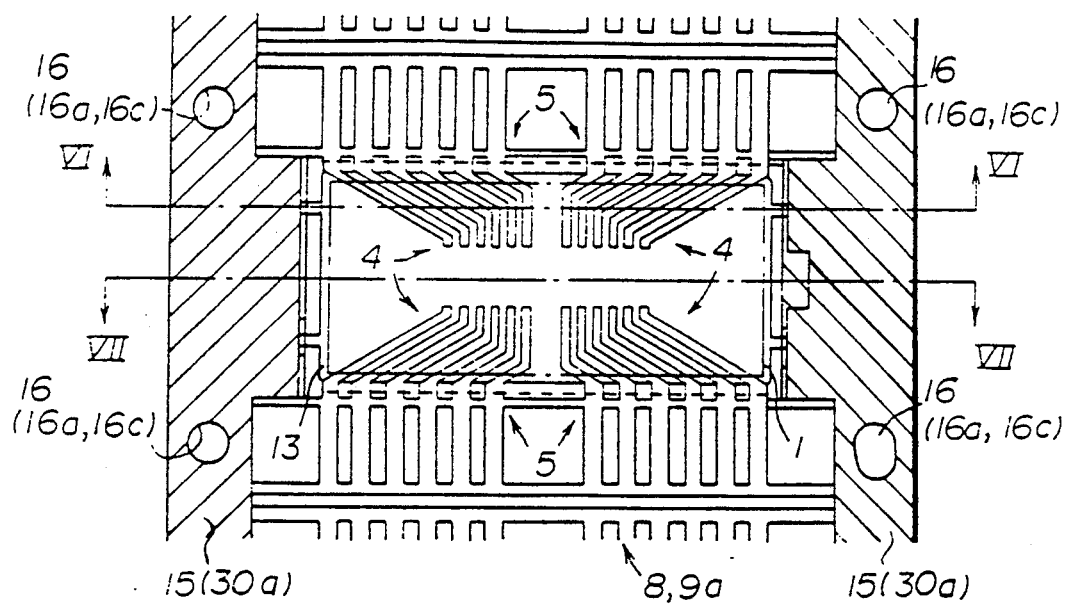
FIGS. 20(A), 20(B) and 20(C) are diagrams for explaining a fourth embodiment of the producing method according to the present invention.
Figure 20B:
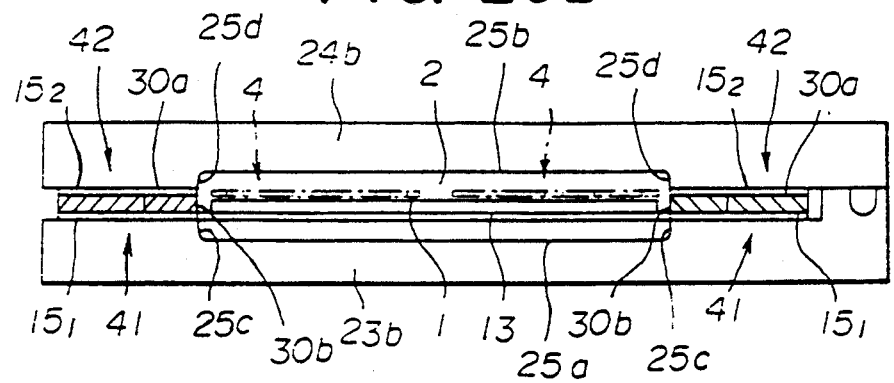
Figure 20C:
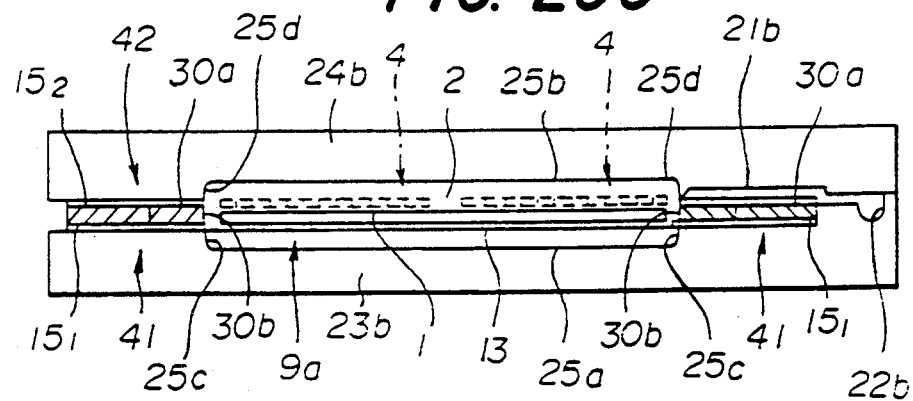

The coefficient of linear expansion of the spacer 30a is set approximately equal to those of the lead frame 8 and the stage frame 9a, similarly as in the case of the spacer 30 shown in FIGS. 19(A) to 19(C).

The lower dies 23b includes flat parts 41 for making contact with and supporting the frame $15_1$ of the stage frame 9a, a package part 25a which has a depth sufficient to encapsulate the semiconductor chip 1 by the encapsulating resin 2, and a runner part 22b which connects to a gate part 21b.

On the other hand, the upper die 24b includes flat parts 42 which make contact with the frame $15_2$ of the lead frame 8, a package part 25b which has a depth sufficient to encapsulate the semiconductor chip 1 by the encapsulating resin 2, and the shallow gate part 21b which connects to the runner part 22b.

A continuous surface is formed by a side surface 25d of the package part 25b of the upper die 24b, a side surface 30b of the spacer 30a on the side of the semiconductor chip 1, and a side surface 25c of the package part 25a of the lower die 23b.

The encapsulating resin 2 is injected from the runner part 22a via the gate part 21, so as to form the semicompleted product 14a of the semiconductor device 14 as shown in FIGS. 18(A) and 18(B), similarly to the second and third embodiments of the producing method.

According to this fourth embodiment of the producing method, it is possible to simplify the production process because it is unnecessary to bend the stage frame 9a. In addition, the shapes of the upper and lower dies 24b and 23b are more simple compared to those of the upper and lower dies 24a and 23a used in the third embodiment of the producing method, thereby making it possible to further reduce the cost of the upper and lower dies 24b and 23b.

Next, a description will be given of a bonding process of the producing method. According to the second through fourth embodiments of the producing method, the circuit forming surface 1a of the semiconductor chip 1 and the inner leads 4 are separated in the state wherein the lead frame 8 and the stage frame 9 or 9a are stacked, and the inner leads 4 are wire bonded to the semiconductor chip 1 in this state.

Accordingly, if the conventional wire bonding technique using ultrasonic waves is employed, it is difficult to positively make the wire bonding because the bonding parts of the inner leads 4 vibrate. Hence in the present invention, it is possible to make a more reliable wire bonding by taking the following measures.

Figure 21A:
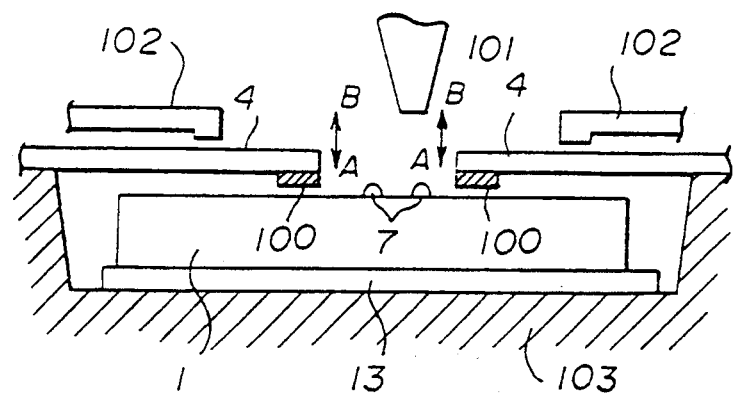
FIGS. 21(A), 21(B) and 21(C) are diagrams for explaining a wire bonding process which is used in the producing method according to the present invention.
Figure 21B:
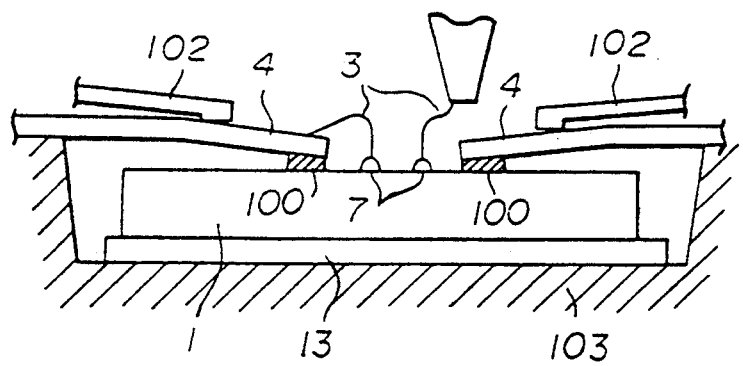
Figure 21C:
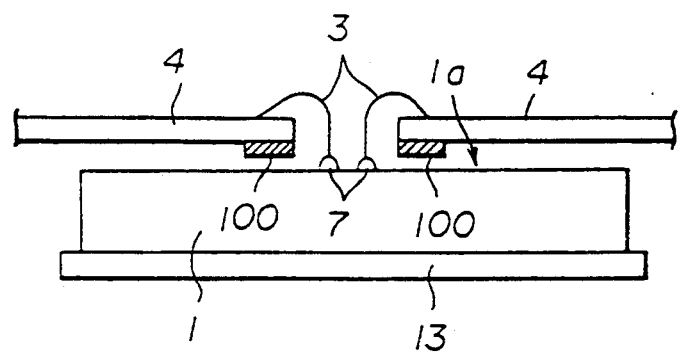

FIGS. 21(A) to 21(C) are diagrams for explaining the wire bonding process. FIG. 21(A) generally shows a wire bonder, and FIG. 21(B) and FIG. 21(C) respectively explain the bonding process.

In FIG. 21(A), the semiconductor chip 1 which is to be wire bonded is placed on the stage 13 of the stage frame 9, and the inner leads 4 of the lead frame 8 are arranged above the semiconductor chip 1 so that a gap is formed between the circuit forming surface 1a of the semiconductor chip 1 and the inner leads 4. Shock absorbing members 100 are arranged on the tip end bottom surfaces of the inner leads 4 confronting the circuit forming surface 1a.

A plurality of bonding pads 7 made of aluminum electrodes are arranged at a central part on the circuit forming surface 1a of the semiconductor chip 1. The lead frame 8 and the stage frame 9 are stacked and placed on a heater 103.

A capillary 101 which forms a part of the wire bonder is positioned above the semiconductor chip 1. A hole having a diameter slightly greater than the diameter of the bonding wire is formed in the capillary 101. The bonding wire is inserted through this hole of the capillary 101 and is supplied under guidance thereby. The capillary 101 is mounted on a transducer (not shown). The transducer vibrates due to ultrasonic oscillation, and connects the bonding wire by ultrasonic bonding.

A frame holder 102 which also forms a part of the wire bonder is arranged above the inner leads 4. As shown in FIG. 21(A), the frame holder 102 has L-shaped tip ends, and each tip end is pivotable for selective movement in directions A and B.

As shown in FIG. 21(B), an appropriate weight is applied on top of the inner leads 4 by pivoting the tip ends of the frame holder 102 in the direction A, so that the shock absorbing members 100 make contact with the circuit forming surface 1a of the semiconductor chip 1. The weight applied on top of the inner leads 4 is not excessively large so as to prevent the circuit forming surface 1a from becoming damaged. In addition, the weight applied on top of the inner leads 4 is sufficiently large so that the tip ends of the inner leads 4, to which the bonding wires 3 are connected, make contact with the circuit forming surface 1a and is mechanically stable to enable stable ultrasonic bonding.

The bonding wire 3 is guided by the capillary 101 in the state wherein the shock absorbing members 100 make contact with the circuit forming surface 1a by the action of the frame holder 102. Further, the wire bonding is made so that the bonding wire 3 connects a predetermined inner lead 4 to the corresponding bonding pad 7.

When the wire bonding is completed for all of the inner leads 4, the tip ends of the frame holder 102 are pivoted so as to move in the direction B, and the weight applied on the inner leads 4 is released. As a result, the inner leads 4 return to their original state by the resiliency thereof, and the inner leads 4 become parallel to the circuit forming surface 1a. In this state, the gap is formed between the inner leads 4 and the circuit forming surface 1a as shown in FIG. 21(C).

By bonding the semiconductor chip 1 and the inner leads 4 in the above described manner, it becomes possible to perform highly reliable wire bonding with respect to the semiconductor device having the LOC structure such that the gap is formed between the semiconductor chip and the inner leads. Thereafter, the resin encapsulation by the encapsulating resin 2 is made by any of the methods described above with reference to FIGS. 16 through 20(C), and the semiconductor device having the same configuration as that shown in FIGS. 12(A) and 12(B) is completed. In this completed semiconductor device, the shock absorbing members 100 are provided on the inner leads 4 and separated from the circuit forming surface 1a of the semiconductor chip 1.

The stage frame 9 releases the heat generated from the semiconductor chip 1 to the outside. But because the metal stage frame 9 and the encapsulating resin 2 make contact, a crack may be formed in the package, that is, the encapsulating resin 2, due to the difference in the coefficients of expansion. For this reason, it is desirable to minimize the area of contact between the stage frame 9 and the encapsulating resin 2 in order to prevent cracking of the encapsulating resin 2.

Next, a description will be given of embodiments of the stage frame which are designed to minimize the area of contact between the stage frame and the encapsulating resin, by referring to FIGS. 22(A) through 25(B). Each of FIGS. 22(A) through 25(A) shows a plan view, and each of FIGS. 23(A) through 25(B) shows an elevational view.

In a stage frame 50 shown in FIGS. 22(A) and 22(B), stages 51b and 51a for respectively supporting right and left end parts of the semiconductor chip 1 are connected to and supported on the frame 15 via stage supports 52b and 52a, which have bending parts.

Figure 23A:
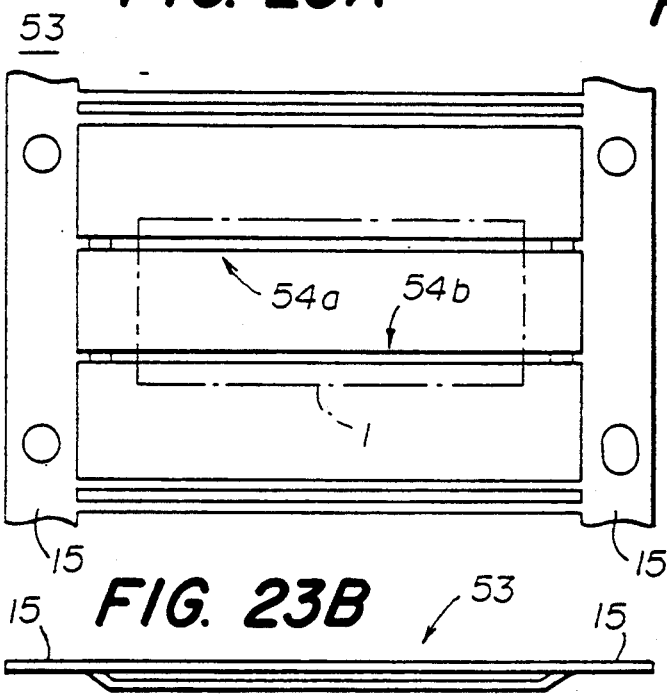
Figure 23C:
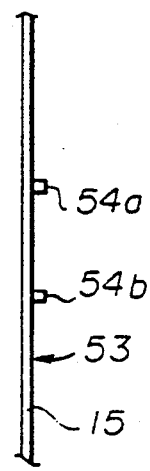
Figure 23B:

In a stage frame 53 shown in FIGS. 23(A) to 23(C), two rod support parts 54a and 54b which respectively have bent parts on the right and left ends thereof are connected to the frame 15. The semiconductor chip 1 is supported along the horizontal direction in FIG. 23(A) by these two rod support parts 54a and 54b.

Figure 24A:
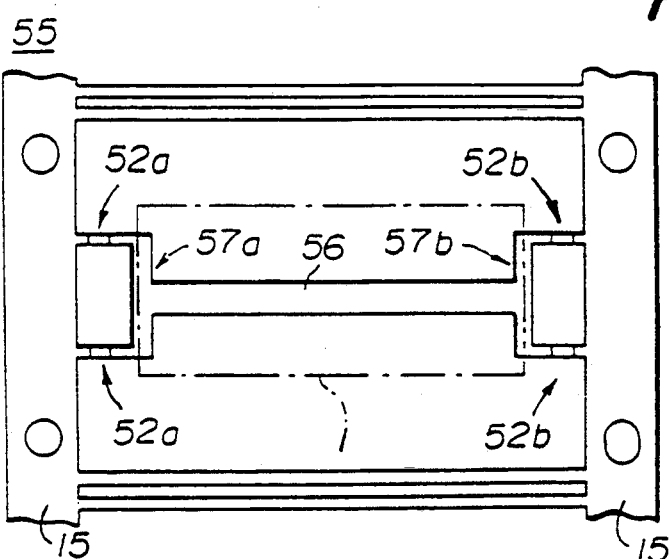
Figure 24C:
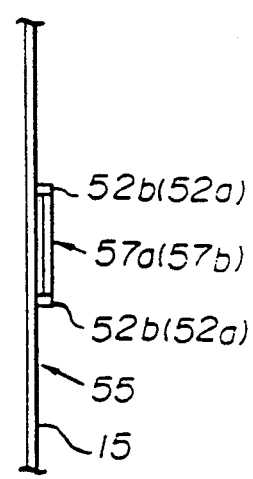
Figure 24B:
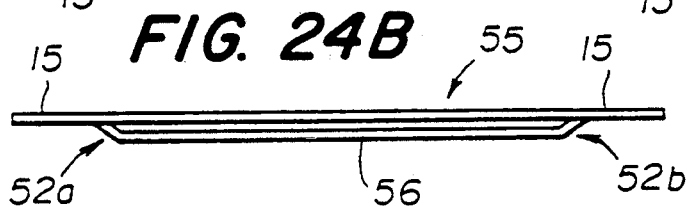

In a stage frame 55 shown in FIGS. 24(A) to 24(C), a stage 56 supports the central part of the semiconductor chip 1 along the horizontal direction in FIG. 24(A). The stage 56 connects to T-shaped parts 57a and 57b, and the T-shaped parts 57a and 57b further connect to the frame 15 via respective stage support parts 52a and 52b.

Figure 25A:
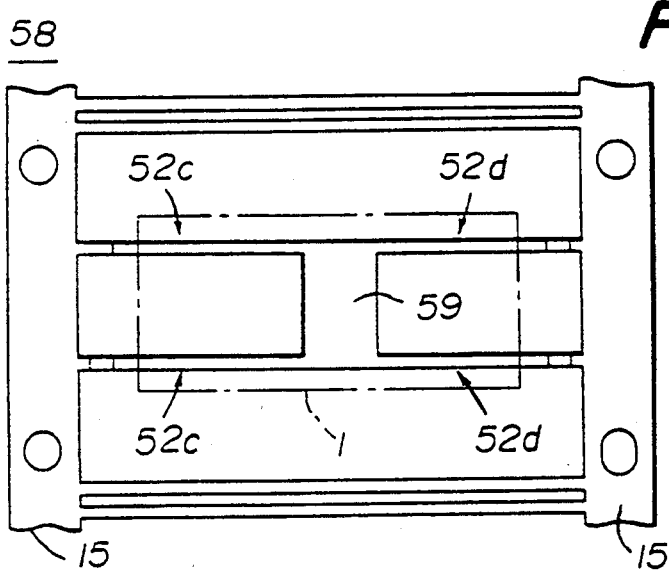
Figure 25C:
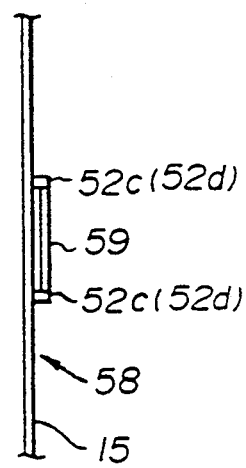
Figure 25B:
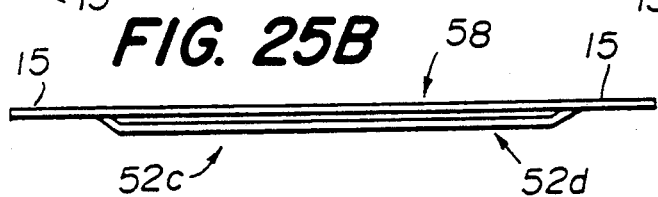

In a stage frame 58 shown in FIGS. 25(A) to 25(C), a stage 59 supports the central part of the semiconductor chip 1 along the vertical direction in FIG. 25(A). Opposite ends of the stage 59 are connected to the frame 15 via respective stage support parts 52c and 52d.

According to the stage 56 of the stage frame 55, it is possible to effectively support the weight on the semiconductor chip 1 during the bonding process if the bonding pads on the semiconductor chip 1 are arranged in the common horizontal direction of FIG. 24(A).

On the other hand, according to the stage 59 of the stage frame 58, it is possible to effectively support the weight on the semiconductor chip 1 during the bonding process if the bonding pads on the semiconductor chip 1 are arranged in the vertical direction of FIG. 25(A).

According to the stage frames 50, 53, 55 and 58, stepped parts (or differences in heights) are formed between the frame 15 and the stages 51a, 51b, 56 and 59 and the support parts 54a and 54b by the provision of the bending parts. The distances between the top surface of the frame 15 and the top surfaces of the stages 51a, 51b, 56 and 59 and the support parts 54a and 54b, in the vertical direction in FIGS. 22(B), 23(B), 24(B), and 25(B) are respectively greater than the thickness of the semiconductor chip 1.

Therefore, when the semiconductor chip 1 is placed on any of the stages 51a, 51b, 56 and 59 and the support parts 54a and 54b and the lead frame 8 (not shown) is placed thereon, the circuit forming surface 1a of the semiconductor chip 1 becomes separated from the lead frame 8, thereby maintaining the insulation between the lead frame 8 and the semiconductor chip 1.

The gap is formed between the circuit forming surface 1a of the semiconductor chip 1 and the lead frame 8, regardless of which one of the stage frames described above is used. Hence, the semiconductor device which is obtained can positively encapsulate by the encapsulating resin 2 a semiconductor chip which is only slightly smaller than the package, similarly to the semiconductor device 14. As a result, it is possible to realize a semiconductor device having the MF-LOC structure such that the size of the package is reduced to approximately the size of the semiconductor chip encapsulated therein.

Next, a description will be given of the process of bending the stage support parts 130a and 130b of the stage frame 9 shown in FIGS. 14(A) to 14(C). As shown in FIG. 26, the stage frame 9 is placed on a lower base 101 of a press and is fixed at a part P, and an upper part 102 is moved down in a direction X so as to bend the stage frame 9 as indicated by a dotted line.

However, although the stage support part 130a, for example, has a length a as shown in FIG. 27(A) before being press formed, the stage support part 130a has an expanded length a' (a'>a) after the bending as shown in FIG. 27(B). If the thickness of the stage frame 9 is denoted by t, the limit of the bending is such that t'=1.5t to 2.0t. If the bending exceeds this limit and t' becomes greater than 2.0t, the stage frame 9 may break at the stage support part 130a.

Hence, in the third embodiment of the semiconductor device, the stage support parts 130a and 130b are provided with the bending parts 10. The bending parts 10 facilitate the bending of the stage support parts 130a and 130b, and help prevent breaking of the stage support parts 130a and 130b during the bending process of the stage frame 9.

Figure 28A:
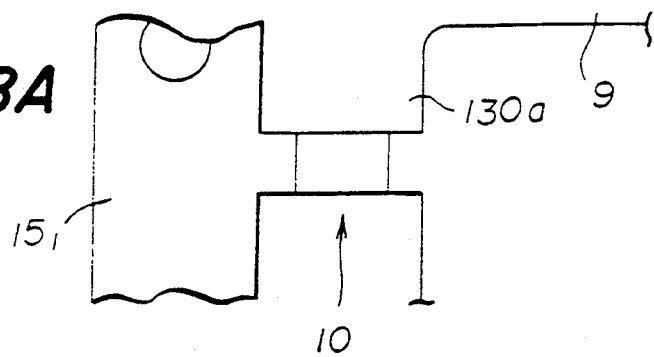
FIGS. 28(A) and 28(B) show an embodiment of a bending part of the stage support part.
Figure 28B:
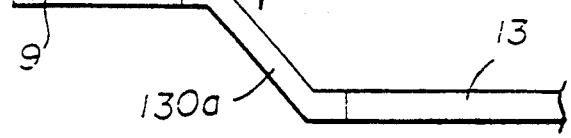

FIGS. 28(A) and 28(B) show an embodiment of the bending part 10. FIG. 28(A) shows a plan view, and FIG. 28(B) shows a side view. In this embodiment, the bending part 10 has a reduced width compared to the remaining parts of the stage support part 130a, so as to facilitate the bending of the stage support part 130a. For example, this bending part 10 may be formed by partially etching, and thereby removing a part of the stage support part 130a.

Figure 29A:
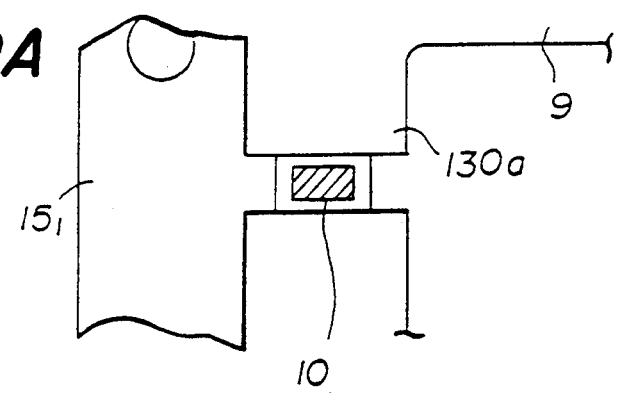
FIGS. 29(A) and 29(B) show another embodiment of the bending part of the stage support part.
Figure 29B:
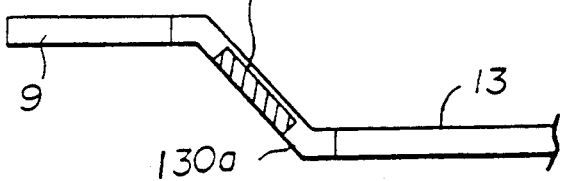

FIGS. 29(A) and 29(B) show another embodiment of the bending part 10. FIG. 29(A) shows a plan view, and FIG. 29(B) shows a side view. In this embodiment, the bending part 10 has a reduced width and a reduced thickness compared to the remaining parts of the stage support part 130a, so as to facilitate the bending of the stage support part 130a. For example, this bending part 10 may be formed by partially etching and thereby removing a part of the stage support part 130a or press forming and thereby removing the reduced thickness part.

According to the third embodiment of the semiconductor device, for example, the gap between the inner leads 4 and the circuit forming surface 1a of the semiconductor chip 1 is determined by the precision with which the cavity or space is formed in the stage frame 9 to accommodate the semiconductor chip 1. Hence, when bending the stage frame 9, the tolerance of this gap must be taken into consideration.

However, although the bending which takes the tolerance into consideration may be realized when the thickness of the package is relatively large, it becomes extremely difficult to accurately bend the stage frame 9 while taking the tolerance into consideration if the thickness of the package is small. In the latter case, the space between the stage frame 9 and the inner leads 4 cannot be formed accurately. As a result, the gap between the inner leads 4 and the circuit forming surface 1a cannot be formed accurately, and the encapsulating resin 2 cannot satisfactorily fill the gap between the inner leads 4 and the circuit forming surface 1a if the gap becomes too narrow. If the encapsulating resin 2 cannot fully fill the gap, the reliability of the semiconductor device greatly deteriorates.

Figure 30:
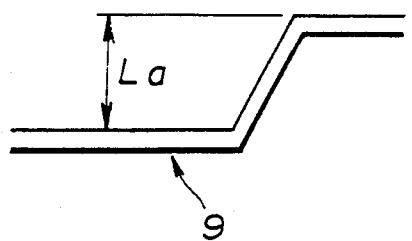
FIG. 30 is a side view for explaining a target value for bending the stage frame.
Figure 31:
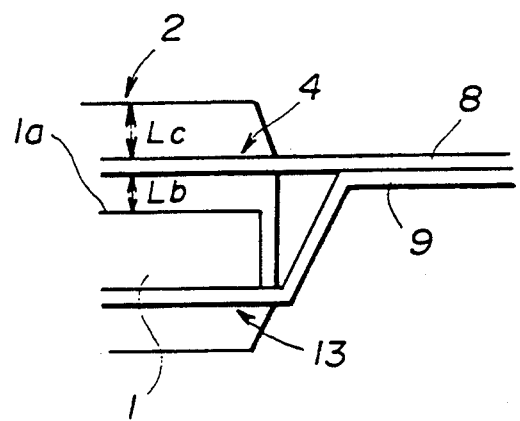
FIG. 31 is a cross sectional view for explaining thicknesses of an encapsulating resin at various parts of the semiconductor device.

FIG. 30 shows a target value La for the space between the stage frame 9 and the inner leads 4. For example, the stage frame 9 can be bent to the target value La±0.1 mm. On the other hand, FIG. 31 shows a cross section of the semiconductor device. The encapsulating resin 2 above the inner leads 4 has a thickness Lc, and the encapsulating resin 2 between the inner leads 4 and the circuit forming surface 1a of the semiconductor chip 1 is Lb. Hence, if the target value La has the error of ±0.1 mm, the thickness Lb may vary in a range of ±0.1 mm. If the thickness of Lc can be reduced so that the thickness Lb can be increased without increasing the overall thickness of the semiconductor device, it is possible to substantially neglect the error of ±0.1 mm which may occur in the target value thickness Lb. However, when the overall thickness of the semiconductor device is relatively small, the thickness Lc cannot be reduced and it is therefore impossible to increase the thickness Lb.

Figure 32:
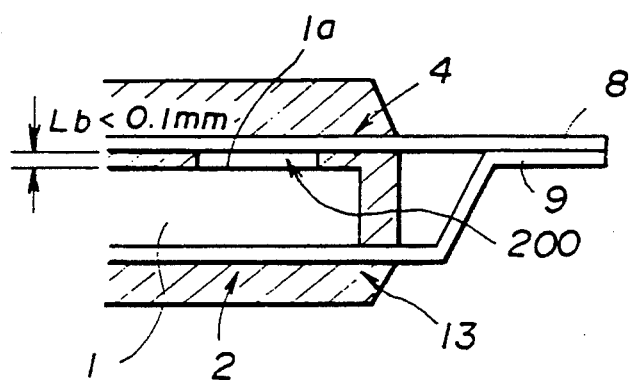
FIG. 32 is a cross sectional view for explaining an unfilled part formed between the inner leads and the circuit forming surface of the semiconductor chip.

The present inventor has found that when the thickness Lb<0.1 mm, the encapsulating resin 2 may not satisfactorily fill the gap between the inner leads 4 and the circuit forming surface 1a of the semiconductor chip 1 as shown in FIG. 32. As a result, an unfilled part 200 is formed between the inner leads 4 and the circuit forming surface 1a. In this case, the reliability of the semiconductor device greatly deteriorates due to the insufficient isolation between the inner leads 4 and the circuit forming surface 1a.

Figure 33:
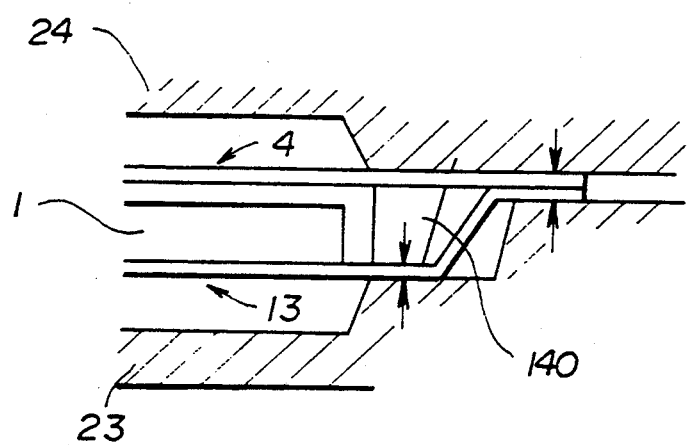
FIG. 33 is a cross sectional view for explaining a fifth embodiment of the producing method according to the present invention.

Next, the description will be given of a fifth embodiment of the producing method according to the present invention, by referring to FIG. 33.

This embodiment of the producing method utilizes the precision of the upper and lower dies 24 and 23 which are used when encapsulating the semiconductor chip 1 with the encapsulating resin 2. In other words, when the upper and lower dies 24 and 23 are fitted together prior to injecting the encapsulating resin 2 therein, the upper and lower dies 24 and 23 forcibly correct the target value La, particularly by the pressing action at the parts indicated by the arrows. At the part indicated by the arrows on the left side, the spacer 140 and the lower die 23 cooperate to correct the target value La. This spacer 140 also functions similarly to the spacer 140 of the embodiment shown in FIG. 11.

As a result, the error of the target value La is corrected to the range of La ±0.02 mm to La ±0.03 mm regardless of the size of the error introduced at the time of bending the stage frame 9 as shown in FIG. 30. For this reason, this embodiment of the producing method can guarantee the gap between the inner leads 4 and the circuit forming surface 1a of the semiconductor device 1, that is, the thickness Lb shown in FIG. 31, to the designed value. In other words, the formation of the unfilled part 200 shown in FIG. 32 positively prevented.

Figure 34A:
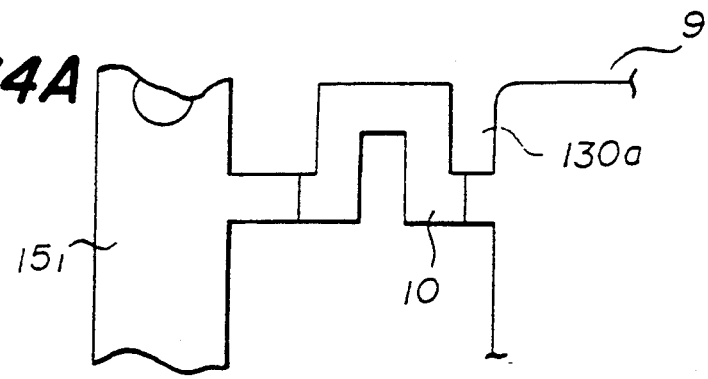
FIGS. 34(A) and 34(B) are diagrams showing an essential part of a stage support part used in the fifth embodiment of the method.
Figure 34B:
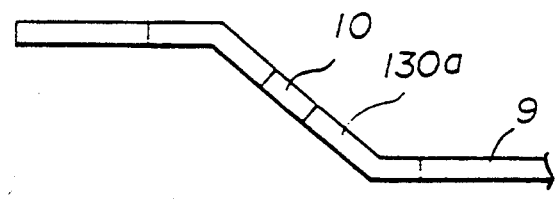
Figure 35A:
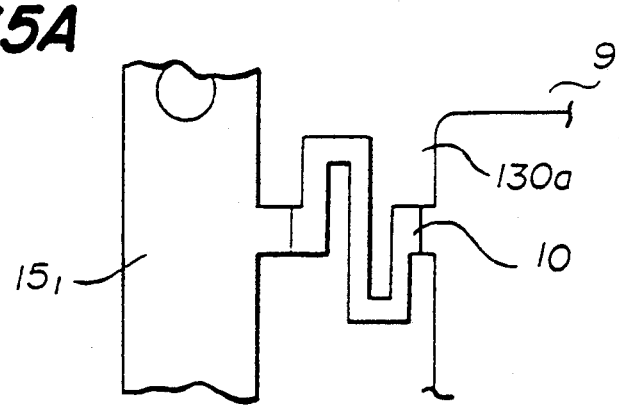
FIGS. 35(A) and 35(B) are diagrams showing an essential part of another stage support part used in the fifth embodiment of the method.
Figure 35B:
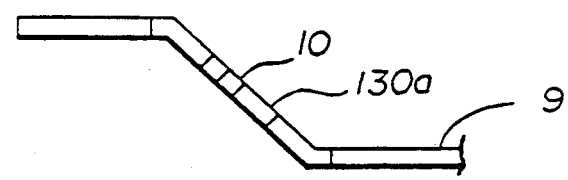

FIGS. 34(A) to 35(B) show embodiments of the bending part 10 of the stage support part 130a (and 130b) for facilitating the correction of the target value La by the upper and lower dies 24 and 23. Each of FIGS. 34(A) and 35(A) shows a plan view, and each of FIGS. 34(B) and 35(B) shows a side view.

In FIG. 34(A), the bending part 10 has a generally inverted U-shape. On the other hand, the bending part 10 shown in FIG. 35(A) has a zigzag shape. These shapes of the respective bending parts 10 facilitate the correction of the target value La because slight expansion or contraction can be absorbed thereby.

Figure 36A:
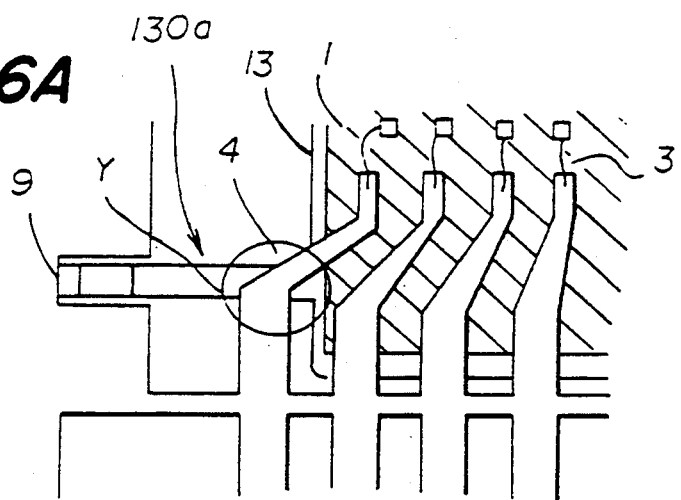
FIGS. 36(A) and 36(B) show a fourth embodiment of the semiconductor device according to the present invention.
Figure 36B:
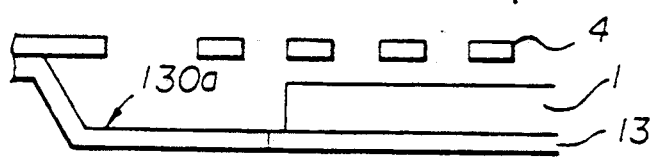

Next, a description will be given of a fourth embodiment of the semiconductor device according to the present invention, by referring to FIGS. 36(A) and 36(B). In FIGS. 36(A) and 36(B), those parts which are the same as those corresponding parts in FIGS. 12(A) through 15(C) are designated by the same reference numerals, and a description thereof will be omitted.

FIG. 36(A) shows a partial plan view, and FIG. 36(B) shows a partial cross sectional view.

As indicated by an encircled part Y in FIG. 36(A), the inner lead 4 and the stage support part 130a intersect in the plan view. This intersection in the plan view is made possible because two frames 15₁ and 15₂, that is, the stage frame 9 and the lead frame 8, are stacked and aligned using the positioning holes 16, the latter located at parts which do not remain as a part of the package. Because this intersection in the plan view is made possible, this embodiment of the semiconductor device has an additional advantage in that the freedom of design of the inner leads 4 is increased. In other words, the inner leads 4 can be designed with a greater degree of freedom compared to the case where the above intersection in the plan view is impossible.

Next, a description will be given of a fifth embodiment of the semiconductor device according to the present invention, by referring to FIGS. 37(A) and 37(B). FIG. 37(A) shows a front view of the semiconductor device with a part shown in cross section, and FIG. 37(B) shows a side view of the semiconductor device with a part shown in cross section. In FIGS. 37(A) and 37(B), those parts which are the same as those corresponding parts in FIGS. 12(A) and 12(B) are designated by those same reference numerals, and a description thereof will be omitted.

In this embodiment, the bottom surface of the stage 13 is exposed from the encapsulating resin 2. In other words, no encapsulating resin 2 is formed on the bottom surface of the stage 13. As a result, the stage 13 itself acts as a radiator for efficiently radiating the heat which is generated from the semiconductor chip 1 during operation. In addition, the elimination of the encapsulating resin 2 on the bottom surface of the stage 13 efficiently reduces the thickness of the semiconductor device (package), even though two frames 15₁ and 15₂, that is, the stage frame 9 and the lead frame 8, are used.

Further, the present invention is not limited to these embodiments, but various variations and modifications may be made without departing from the scope of the present invention.

What is claimed is:

1. A method of producing a semiconductor device comprising a semiconductor chip mounted on a stage, lower leads with which the stage is integrally interconnected, upper leads which are spaced from the lower leads, and an encapsulating resin which encapsulates the semiconductor chip and defines the purer periphery of the device, as produced, said method comprising the steps of:
   (a) providing each of the upper leads, the lower leads, and the stage with corresponding integral extensions, the upper leads including first integral extensions respectively corresponding to the stage integral extensions and second integral extensions respectively corresponding to the lower lead integral extensions;
   (b) providing a spacer having a thickness greater than the thickness of the semiconductor chip;
   (c) affixing the semiconductor chip on the stage and assembling, and selectively connecting, the upper and lower leads with each other and with the semiconductor chip as thus affixed to the stage, the assembling and selectively connecting step further comprising superposing the first integral extensions of the upper leads on the respectively corresponding integral extensions of the lower leads and simultaneously assembling the second integral extensions of the upper leads and the respectively corresponding integral extensions of the stage, with the spacer interposed therebetween, the spacer maintaining a gap between the upper leads and the semiconductor chip;
   (d) encapsulating the semiconductor chip with the encapsulating resin, including filling the gap with the resin; and
   (e) removing the spacer after said step (d).

2. The method as claimed in claim 1, further comprising selecting the upper leads and the lower leads of respective, different materials.

3. The method as claimed in claim 1, further comprising forming each of the lower leads so as to include a central portion and opposite end portions angularly related to and extending from the central portion, the integral extensions of the lower leads extending from the respective opposite end portions in an angled relationship thereto so as to be parallel to the central portion, the step of assembling, in superposed relationship, the respective integral extensions of the respectively corresponding upper and lower leads thereby maintaining the upper leads in approximately parallel relationship with respect to the central portions of the lower leads and within the periphery of the device, as defined by the encapsulating resin.

4. The method as claimed in claim 3, further comprising selecting the extent of the opposite end portions of the lower leads relatively to the thickness of the spacer so that the respectively corresponding and superposed extensions of the upper leads and the lower leads remain in contact in the superposed relationship thereof and extend exteriorly of the encapsulating resin.

5. A method of producing a semiconductor device comprising the steps of:
   (a) providing a stage having a central chip-mounting stage portion and integral support parts extending outwardly from the central chip-mounting stage portion and, while supporting the stage by the integral support parts, mounting a semiconductor chip on the central chip-mounting stage portion of the stage, said semiconductor chip having a circuit forming surface having contacts thereon;
   (b) providing a lead frame having plural leads, each lead comprising an inner lead with a tip end and an integral, outer lead;
   (c) disposing the lead frame in a position parallel to but spaced from the circuit forming surface of the semiconductor chip so as to define a gap therebetween, and with an outer portion of each outer lead aligned with an outer portion of a corresponding, integral support part of the stage, and electrically connecting each of the inner leads at the respective tip ends thereof to corresponding contacts on the circuit forming surface of the semiconductor chip; and
   (d) encapsulating the semiconductor chip and the inner leads by an encapsulating resin and so as to fill the gap between the inner leads and the circuit forming surface of the semiconductor chip and such that the encapsulating resin defines the perimeter of the device, as produced, the inner leads of the lead frame thus being parallel to and spaced from the central chip-mounting stage portion of the stage within the perimeter of the device and the respective outer portions of the integral support parts of the stage and of the integral, outer leads of the lead frame extending outwardly from the perimeter of the device as defined by the encapsulating resin.

6. The method as claimed in claim 5, wherein the size of the device, as defined by the encapsulating resin, is slightly larger than the size of the semiconductor chip.

7. The method as claimed in claim 5, further comprising supporting the stage and thereby the chip and the lead frame by the stage support parts during each of said steps (a), (b), (c) and (d), the height position of the inner leads during said step (c) being higher than that of the stage.

8. The method as claimed in claim 7, which further comprises the steps of:
(e) cutting the portions of the stage support parts which extend outwardly from the perimeter of the produced device; and
(f) cutting the outer leads at a position of each thereof which is outwardly of the perimeter of the device so as to define a portion of each outer lead of a desired length extending outwardly from the perimeter of the device.

9. The method as claimed in claim 5, further comprising:
providing a stage frame comprising a first frame, the stage and stage support parts which connect the stage to the first frame, said stage support parts having corresponding bent portions such that the stage is disposed at a height position which is lower than that of the first frame by a distance corresponding to the thickness of the semiconductor chip;
providing the lead frame as a second frame, the inner leads being connected to the second frame via the outer leads; and
placing the lead frame on top of the stage frame before making the electrical connections.

10. The method as claimed in claim 9, further comprising:
providing respective, corresponding positioning holes in the first and second frames; and
when placing the lead frame on top of the stage frame, aligning the lead frame relative to the stage frame by aligning the respective, corresponding positioning holes of the first and second frames.

11. The method as claimed in claim 10, further comprising:
removing the produced device as encapsulated by the encapsulating resin from the stage frame and the lead frame by cutting the stage support parts extending outwardly of the perimeter of the encapsulating resin; and
cutting the outer leads, in the portions thereof which extend beyond the perimeter of the encapsulating resin at a position of each, outwardly from the perimeter, so as to define a portion of each outer lead of a desired length extending outwardly from the perimeter of the device.

12. The method as claimed in claim 9, wherein the bent portion of each stage support part includes a part which is thinner than the remainder of the bent portion, the thinner part absorbing expansion and contraction of the stage.

13. The method as claimed in claim 9, further comprising performing the encapsulating step by employing upper and lower dies having edge portions which sandwich the lead frame and the stage frame therebetween and a center portion defining a cavity which accommodates the leads of the lead frame and performing the encapsulating step by injecting the encapsulating resin into the cavity defined by the upper and lower dies, said upper and lower dies establishing and maintaining the height position of the stage relative to the first frame thereby to limit any error in the distance therebetween to within a desired tolerance.

14. The method as claimed in claim 13, further comprising providing bent portions in the stage support parts which absorb stress otherwise produced in the stage frame when sandwiched by the upper and lower dies.

15. The method as claimed in claim 13, further comprising interposing a spacer between the stage frame and the lead frame, in respective peripheral edge portions thereof which are engaged by the corresponding peripheries of the upper and lower dies and thus exteriorly of the cavity into which the encapsulating resin is injected, and so as to maintain the stage approximately parallel to the inner leads within the encapsulating resin, said upper and lower dies and said spacer establishing and maintaining the height position of the stage relative to the first frame.

16. The method as claimed in claim 9, further comprising positioning the lead frame relative to the stage frame so that the stage is approximately parallel to the inner leads within the encapsulating resin.

17. The method as claimed in claim 16, further comprising interposing a spacer between the stage frame and the lead frame, in respective peripheral edge portions thereof which are engaged by the corresponding peripheries of the upper and lower dies and thus exteriorly of the cavity into which the encapsulating resin is injected, and so as to maintain the stage approximately parallel to the inner leads within the encapsulating resin.

18. The method as claimed in claim 17, further comprising positioning the lead frame on the stage frame so that the lead frame makes contact with the stage frame in respective portions thereof which are positioned exteriorly of the perimeter of the encapsulating resin.

19. The method as claimed in claim 5, further comprising:
providing a shock absorbing member on a surface of the tip end of each inner lead, which surface confronts the circuit forming surface of the semiconductor chip; and
urging the inner leads against the circuit forming surface to stabilize the inner leads while electrically connecting the inner leads to the respectively corresponding contacts on the circuit forming surface of the semiconductor chip.

20. The method as claimed in claim 5, wherein said step of encapsulating the semiconductor chip, further, completely fills the gap between the lead frame and the circuit forming surface of the semiconductor chip with the encapsulating resin.

21. The method as claimed in claim 5, wherein said step of encapsulating the semiconductor chip is performed so as to maintain at least a part of a bottom surface of the stage spaced from and thus not covered by the encapsulating resin.

22. The method as claimed in claim 5, further comprising positioning the inner leads relative to the stage so that the stage is approximately parallel to the inner leads within the encapsulating resin.

23. The method as claimed in claim 5, further comprising:

in step (a), forming each integral support part so as to include a first portion which is bent and extends from the chip-mounting stage at an angle relatively thereto and toward the lead frame when the lead frame is disposed at the position specified in step (c) and, further, a second portion, extending from the first portion at an angle relatively thereto and so as to lie in a plane parallel to but spaced from the surface of the lead frame, which lead frame surface is spaced by the gap from the circuit forming surface of the semiconductor chip; and performing the encapsulating step (d) so as to locate the perimeter of the device inwardly of the integral, first bent portions of the integral support parts of the stage.

24. The method as claimed in claim 5, further comprising:

providing a spacer element between the corresponding, aligned outer portions of the integral support parts and the integral outer leads, the spacer having a thickness greater than the thickness of the semiconductor chip and thereby maintaining the gap between the lead frame and the circuit forming surface of the semiconductor chip when the lead frame is disposed in the position specified in step (c) ; and performing the encapsulating step (d) so as to locate the perimeter of the device inwardly of the spacer element.

* * * * *

UNITED STATES PATENT AND TRADEMARK OFFICE
CERTIFICATE OF CORRECTION

PATENT NO. : 5,409,866
DATED : April 25, 1995
INVENTOR(S) : SATO et al.

Page 1 of 2

It is certified that error appears in the above-indentified patent and that said Letters Patent is hereby corrected as shown below:

TITLE PAGE:

* [73] Assignee: Change "Kagoshima" to --Satsuma--.

[56] References Cited:

Under U.S. PATENT DOCUMENTS, add
--5,108,955  4/1992  Ishida et al. ....... 437/214--;

Under FOREIGN PATENT DOCUMENTS, add
--0 095 918  12/1983  European Patent Office .--;

Add: --OTHER REFERENCES

<u>PATENT ABSTRACTS OF JAPAN</u>, Vol. 8, No. 173 (E-259)[1610], Aug. 9, 1984 & JP-A-59-066157, Apr. 14, 1984.

<u>PATENT ABSTRACTS OF JAPAN</u>, Vol. 11, No. 59 (E-482)[2506], Feb. 24, 1987 & JP-A-61-218139, Sept. 27, 1986.--

[57] ABSTRACT:

line 4, delete "where"; and change "is" to --being--;
line 6, after "chip," insert --and--;
line 7, delete "where"; and change "is" to --being--;
line 9, change ", and an" to --. An--; and delete "which";
line 10, change "chip so as to maintain" to --chip, the resin filling and thereby maintaining--.

UNITED STATES PATENT AND TRADEMARK OFFICE
CERTIFICATE OF CORRECTION

PATENT NO. : 5,409,866
DATED : April 25, 1995
INVENTOR(S) : SATO et al.

It is certified that error appears in the above-indentified patent and that said Letters Patent is hereby corrected as shown below:

Col. 1, line 33, change "1(-A)" to --1(A)--.

Col. 13, line 67, change "cf" to --of--.

Col. 20, line 19, after "respective" insert --,--.

Signed and Sealed this

Eleventh Day of February, 1997

Attest:

BRUCE LEHMAN

*Attesting Officer*   *Commissioner of Patents and Trademarks*